US012575237B2

(12) United States Patent
Lee et al.

(10) Patent No.: US 12,575,237 B2
(45) Date of Patent: Mar. 10, 2026

(54) MANUFACTURING METHOD FOR DISPLAY DEVICE AND DISPLAY DEVICE MANUFACTURED USING THE SAME

(71) Applicant: Samsung Display Co., LTD., Yongin-si (KR)

(72) Inventors: Jun Young Lee, Yongin-si (KR); Si Joon Song, Yongin-si (KR); Youn Woong Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 629 days.

(21) Appl. No.: 17/994,662

(22) Filed: Nov. 28, 2022

(65) Prior Publication Data

US 2023/0268475 A1     Aug. 24, 2023

(30) Foreign Application Priority Data

Feb. 24, 2022    (KR) ........................ 10-2022-0024516

(51) Int. Cl.
| | |
|---|---|
| *H10H 20/85* | (2025.01) |
| *H05K 1/189* | (2026.01) |
| *H10H 20/01* | (2025.01) |
| *H10H 20/831* | (2025.01) |
| *H10H 20/84* | (2025.01) |
| *H10H 20/857* | (2025.01) |

(52) U.S. Cl.
CPC ........... *H10H 20/857* (2025.01); *H05K 1/189* (2013.01); *H10H 20/01* (2025.01); *H10H 20/8312* (2025.01); *H10H 20/84* (2025.01); *H10H 20/034* (2025.01); *H10H 20/0364* (2025.01)

(58) Field of Classification Search
CPC .. H10H 20/857; H10H 20/01; H10H 20/8312; H10H 20/84; H10H 20/034; H10H 20/0364; H10H 20/0362; H05K 1/189; H05K 3/323; H01L 25/0753; H10K 50/84; H10K 59/131; H10K 71/00
See application file for complete search history.

(56) References Cited

U.S. PATENT DOCUMENTS

| | | |
|---|---|---|
| 6,862,053 B2 | 3/2005 | Lee et al. |
| 7,782,417 B2 | 8/2010 | Ma et al. |
| 10,330,979 B2 | 6/2019 | Ryu et al. |
| (Continued) | | |

FOREIGN PATENT DOCUMENTS

| | | |
|---|---|---|
| JP | 2000-047209 | 2/2000 |
| KR | 10-0640083 | 10/2006 |
| (Continued) | | |

OTHER PUBLICATIONS

Notice of Allowance for U.S. Appl. No. 17/892,709, dated Sep. 13, 2023.

(Continued)

*Primary Examiner* — S M Sohel Imtiaz
(74) *Attorney, Agent, or Firm* — Womble Bond Dickinson (US) LLP

(57) ABSTRACT

A method for manufacturing a display device includes providing a display layer including a light emitting element; providing a first coupling layer on the display layer; providing a chassis module including a chassis, a second coupling layer, and a chip-on-film; moving the chassis module; and disposing the chassis module on the first coupling layer.

19 Claims, 13 Drawing Sheets

(56)         References Cited

U.S. PATENT DOCUMENTS

| | | | |
|---|---|---|---|
| 12,210,236 | B2 | 1/2025 | Kang et al. |
| 2014/0056025 | A1* | 2/2014 | Kang ................... G02B 6/0083 |
| | | | 362/613 |
| 2016/0079333 | A1* | 3/2016 | Shishido ............. H10K 59/131 |
| | | | 257/72 |
| 2018/0219136 | A1* | 8/2018 | Narag, II .......... H10H 20/8506 |
| 2020/0096819 | A1 | 3/2020 | Fan |
| 2020/0413559 | A1* | 12/2020 | Lee ..................... H04M 1/0277 |
| 2021/0405847 | A1* | 12/2021 | Choi ................... G09G 3/3266 |
| 2022/0013507 | A1* | 1/2022 | Zhang ................ H10H 20/8581 |
| 2024/0113086 | A1* | 4/2024 | Fan ..................... H10H 20/857 |
| 2024/0324392 | A1* | 9/2024 | Yamazaki .......... H10K 59/1201 |

FOREIGN PATENT DOCUMENTS

| | | |
|---|---|---|
| KR | 10-2017-0064111 | 6/2017 |
| KR | 10-2018-0077835 | 7/2018 |
| KR | 10-2009663 | 10/2019 |
| KR | 10-2047225 | 11/2019 |
| KR | 20-0490966 | 1/2020 |
| KR | 10-2021-0001050 A | 1/2021 |
| KR | 10-2021-0049578 A | 5/2021 |
| KR | 10-2022-0002777 A | 1/2022 |

OTHER PUBLICATIONS

Korean Notice of Allowance corresponding to KR Application No. 10-2022-0024516, dated Aug. 26, 2025 (6 pages).

* cited by examiner

140

120

COF

MANUFACTURING METHOD FOR DISPLAY DEVICE AND DISPLAY DEVICE MANUFACTURED USING THE SAME

CROSS-REFERENCE TO RELATED APPLICATION

This application claims priority to and benefit of Korean patent application No. 10-2022-0024516 under 35 U.S.C. § 119(a), filed on Feb. 24, 2022 in the Korean Intellectual Property Office (KIPO), the entire contents of which are incorporated herein by reference.

BACKGROUND

1. Technical Field

The disclosure generally relates to a manufacturing method for a display device and a display device manufactured using the same.

2. Related Art

Recently, as interest in information displays is increased, research and development of display devices have been continuously conducted.

SUMMARY

Embodiments provide a manufacturing method for a display device and a display device manufactured using the same, which can improve process performance and simplify (or streamline) process phases.

In accordance with an aspect of the disclosure, there is provided a method for manufacturing a display device, the method including providing a display layer including a light emitting element; providing a first coupling layer on the display layer; providing a chassis module including a chassis, a second coupling layer, and a chip-on-film; moving the chassis module; and disposing the chassis module on the first coupling layer.

The method may include disposing an overcoat layer on an area of the display layer; and disposing an outer film layer on the overcoat layer.

The disposing of the chassis module on the first coupling layer may include allowing the first coupling layer to electrically connect a line included in the display layer and the chip-on-film to each other.

In the chassis module, one surface of the second coupling layer may contact the chassis, and another surface of the second coupling layer may contact the chip-on-film.

The disposing of the chassis module on the first coupling layer may include allowing the chip-on-film of the chassis module to face the first coupling layer.

The moving of the chassis module may include simultaneously moving the chassis and the chip-on-film.

The chassis module may be moved by using a vacuum pick-up method or an electromagnet.

The disposing of the chassis module on the first coupling layer may include allowing the chassis to be connected to the display layer by the first coupling layer and the second coupling layer; and allowing the chip-on-film to be connected to the display layer by the first coupling layer.

The disposing of the chassis module on the first coupling layer may include deforming the first coupling layer and second coupling layer by compressing the chassis module.

The disposing of the chassis module on the first coupling layer may include curing the first coupling layer and the second coupling layer.

In an area in which the first coupling layer, the second coupling layer, the chip-on-film, and the chassis overlap one another in a plan view, a sum of thicknesses of the first coupling layer, the second coupling layer, the chip-on-film, and the chassis may be equal to a sum of thicknesses of the overcoat layer and the outer film layer.

The chassis may be disposed at a side of the display device, and have a plate shape.

The chassis may have a thickness in a range of about 20 µm to about 100 µm.

The first coupling layer may include a conductive material and a resin material, the second coupling layer may include a resin material without including any conductive material. A portion of the second coupling layer may contact the first coupling layer, and another portion of the second coupling layer may contact the chassis.

The display layer may include a first area and a second area. In the first area, the display layer may overlap the first coupling layer, the second coupling layer, the chip-on-film, and the chassis in a plan view. In the second area, the display layer may overlap the overcoat layer and the outer film layer in a plan view.

In accordance with another aspect of the disclosure, there is provided a method for manufacturing a display device, the method including providing a display layer including a light emitting element; providing a first coupling layer on the display layer; connecting a chassis module to a chassis provider including a guide jig and a module catching part, the chassis module including a chassis, a second coupling layer, and a chip-on-film; moving the display layer on which the first coupling layer is provided along a gravity direction to be adjacent to the chassis module; disposing the chassis module on the display layer; and allowing the display layer to be spaced apart from the chassis provider.

The disposing of the chassis module on the display layer may include deforming the first coupling layer and the second coupling layer by compressing the chassis module; and curing the first coupling layer and the second coupling layer.

The module catching part may include an electromagnet, and be operated in a connection mode in which the module catching part is connected to the chassis module or a release module in which a connection between the module catching part and the chassis module is released.

In accordance with still another aspect of the disclosure, there is provided a display device manufactured according to the method.

In accordance with still another aspect of the disclosure, there is provided a display device including a display layer on a substrate, the display layer including a light emitting element; an outer film layer on the display layer; a flexible circuit board providing an electrical signal provided to the display layer; a chip-on-film including one end connected to the display layer and another end connected to the flexible circuit board; an anisotropic conductive film on the display layer, the anisotropic conductive film overlapping the chip-on-film in a plan view; a non-conductive film on the anisotropic conductive film and the chip-on-film; and a chassis on the non-conductive film. The anisotropic conductive film connects the chip-on-film to the display layer, the non-conductive film connects the chassis to the anisotropic conductive film, and the chassis has a plate shape not including any bending area.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
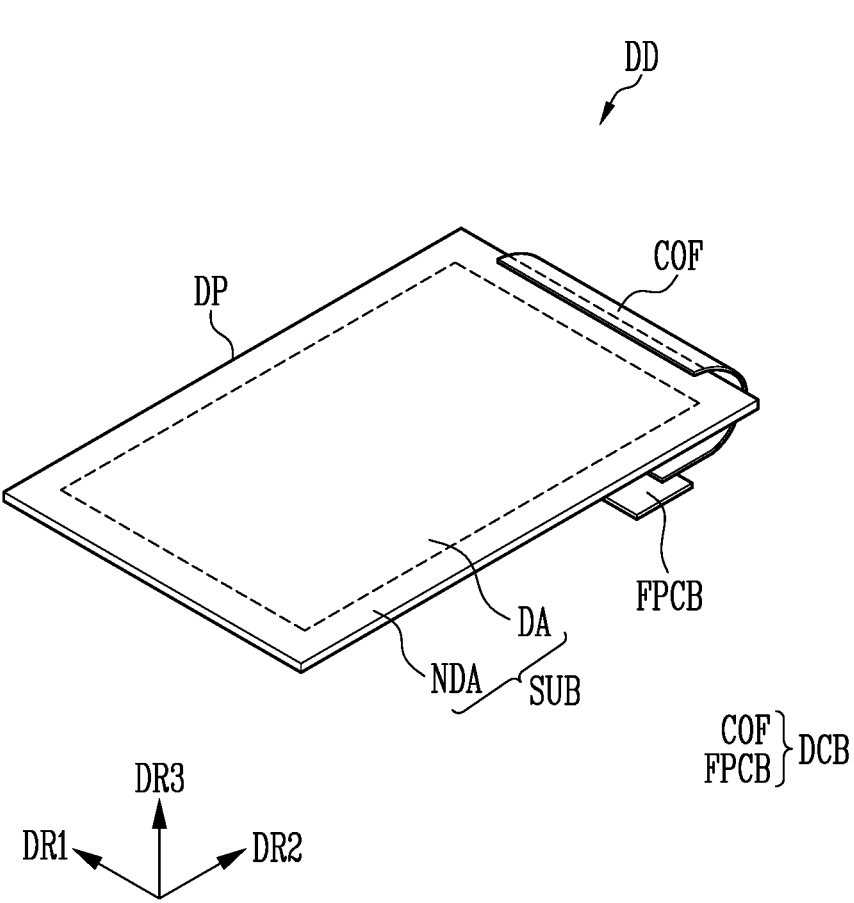
FIG. 1 is a schematic perspective view illustrating a display device in accordance with an embodiment of the disclosure.

The disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

It will be understood that, although the terms "first", "second", and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The disclosure generally relates to a manufacturing method for a display device and a display device manufactured using the same. Hereinafter, a manufacturing method for a display device and a display device manufactured using the same in accordance with an embodiment of the disclosure will be described with reference to the accompanying drawings.

Before describing a manufacturing method for a display device DD in accordance with an embodiment of the disclosure, the display device DD in accordance with the embodiment of the disclosure will be described with reference to FIGS. 1 to 7.

Figure 2:
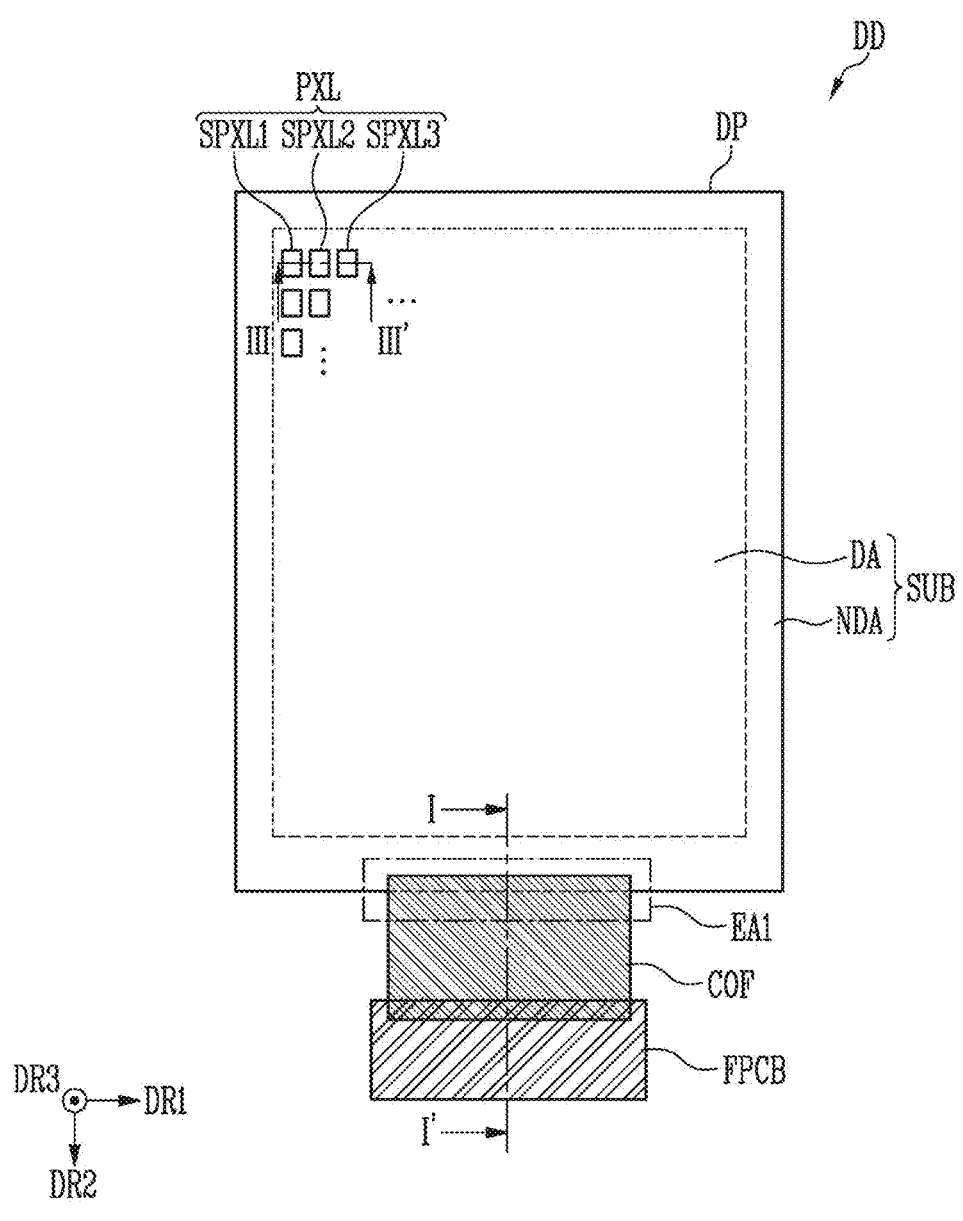
FIG. 2 is a schematic plan view illustrating the display device in accordance with the embodiment of the disclosure.

FIG. 1 is a schematic perspective view illustrating a display device in accordance with an embodiment of the disclosure. FIG. 2 is a schematic plan view illustrating the display device in accordance with the embodiment of the disclosure.

Referring to FIGS. 1 and 2, the display device DD is configured to provide light. The display device DD may include pixels PXL capable of providing light.

The display device DD may include a display panel DP and a driving circuit board DCB.

The display panel DP may include a substrate SUB, the pixels PXL, a driver, and a line part. The driver may include a scan driver, an emission driver, and a data driver.

The substrate SUB may form (or constitute) a base surface of the display device DD. The substrate SUB may include a rigid material or a flexible material according to a purpose of the display device DD. The substrate SUB may include a flexible or rigid substrate or film. However, the material of the substrate SUB applied to the embodiment of the disclosure is not limited to a specific example.

The substrate SUB may include a display area DA and a non-display area NDA. In the display area DA, light may be provided. In the display area DA, the light may be emitted in a display direction of the display device DD (e.g., a third direction DR3). In the non-display area NDA, the light may not be provided.

The pixel PXL may be disposed on the substrate SUB, and include a light emitting element LD (see FIG. 5), thereby emitting light. The pixel PXL may be disposed in the display area DA of the substrate SUB (or in the display area DA of the display device DD). The display area DA may be an area in which the pixel PXL is provided. The non-display area NDA may be an area in which the pixel PXL is not provided.

In accordance with an embodiment, the pixels PXL may be arranged in a matrix form along rows extending in a first direction DR1 and columns extending in a second direction DR2. For example, the pixels PXL may be arranged according to a stripe arrangement structure, a PENTILE™ arrangement structure, or the like. However, the arrangement structure of the pixels PXL is not limited thereto, and the pixels PXL may be arranged in the display area DA according to various structures and/or various manners.

The pixel PXL may include sub-pixels. For example, the pixel PXL may include a first pixel SPXL1, a second pixel SPXL2, and a third pixel SPXL3. At least one first pixel SPXL1, at least one second pixel SPXL2, and at least one third pixel SPXL3 may form (or constitute) a pixel part capable of emitting lights of various colors.

For example, each of the first sub-pixel SPXL1, the second sub-pixel SPXL2, and the third sub-pixel SPXL3 may emit light of a color (e.g., a predetermined or selectable color). For example, the first pixel SPXL1 may be a red pixel emitting light of red (e.g., a first color), the second pixel SPXL2 may be a green pixel emitting light of green (e.g., a second color), and the third pixel SPXL3 may be a blue pixel emitting light of blue (e.g., a third color).

However, the colors, kinds, and/or numbers of first to third pixels SPXL1, SPXL2, and SPXL3 forming (or constituting) each pixel part are not limited to a specific example.

The driver may be disposed in the non-display area NDA in a plan view. One of the scan driver, the emission driver, and the data driver may be disposed together with the line part in the non-display area NDA. In accordance with an embodiment, the driver may be disposed in the display panel DP. The driver may be mounted on the driving circuit board DCB. The position of the driver is not necessarily limited to a specific example.

The driver may provide (or output) electrical information (or signal) provided to the pixel PXL. In case that electrical information is provided to the pixel PXL, the light emitting element LD included in the pixel PXL may emit light.

The scan driver may transfer a scan signal to the pixel PXL along a scan line. The emission driver may provide an emission control signal to the pixel PXL along an emission control line. The data driver may provide a data signal to the pixel PXL along a data line.

The line part may be disposed in the non-display area NDA in a plan view. The line part may electrically connect the driver and the pixel PXL to each other.

The driving circuit board DCB may include a chip-on-film COF and a flexible circuit board FPCB.

The chip-on-film COF may provide an electrical signal acquired based on a signal applied from the flexible circuit board FPCB to the display panel DP (e.g., a display layer DL (see FIG. 3)).

An end of the chip-on-film COF may be connected (or attached) to the display panel DP, and another end of the chip-on-film COF may be connected (or attached) to the flexible circuit board FPCB. At least a portion of the chip-on-film COF may be bent.

The chip-on-film COF may include an insulating film and lines provided on the insulating film. The chip-on-film COF generally refers to a form or structure in which an insulating film configured as (or formed as) a thin film and lines are formed on the insulating film, and may be designated as a tape carrier package, a flexible printed circuit board, or the like. In the chip-on-film COF, although not shown in the drawings, a semiconductor chip connected to at least some of the lines may be further mounted on the insulating film.

A circuit element configured to process an electrical signal to be applied to the display layer DL may be disposed on the flexible circuit board FPCB.

The flexible circuit board FPCB may be disposed on a surface or a back surface of the display panel DP. An end portion of the flexible circuit board FPCB may be connected to the chip-on-film COF having a curved shape to be disposed on the back surface of the display panel DP, and accordingly, the flexible circuit board FPCB is not viewed from the outside.

Figure 3:
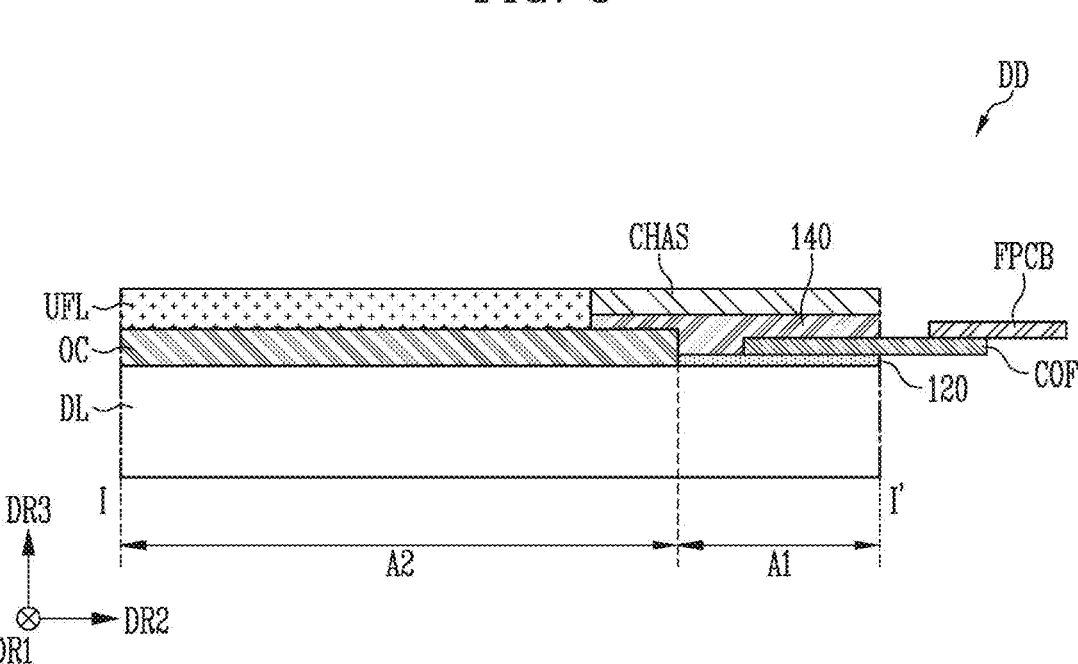
FIG. 3 is a schematic cross-sectional view taken along line I-I' shown in FIG. 2.
Figure 4:
FIG. 4 is a schematic enlarged view of area EA1 shown in FIG. 2.
Figure 4:
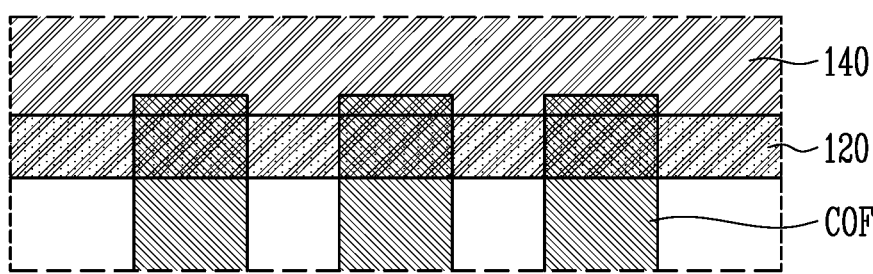
Figure 4:
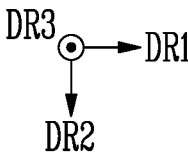

FIG. 3 is a schematic sectional view taken along line I-I' shown in FIG. 2. FIG. 4 is a schematic enlarged view of area EA1 shown in FIG. 2.

Referring to FIGS. 3 and 4, the display device DD may include a display layer DL, an overcoat layer OC, an outer film layer UFL, a chip-on-film COF, a flexible circuit board FPCB, a first coupling layer 120, a second coupling layer 140, and a chassis CHAS.

The display layer DL may be a layer disposed at a side of the display panel DP to emit light. For example, the display panel DP including the display layer DL may be implemented as a self-luminous display panel such as an organic light emitting display panel. However, in case that the display panel DP is implemented as a self-luminous display panel, the disclosure is not limited to a case where each pixel includes only an organic light emitting element. For example, a light emitting element of each pixel may be formed as an organic light emitting diode, an inorganic light emitting diode, a quantum dot/well light emitting diode, or the like. Light emitting elements may be provided in each pixel. The light emitting elements may be connected in series, parallel, series/parallel, or the like. As another example, the display panel DP may be implemented as a non-light-emitting display panel such as a liquid crystal display panel. In case that the display panel DP is implemented as a non-light-emitting display panel, the display device DD may additionally include a light source such as a back-light part. Hereinafter, for convenience of description, an embodiment in which the display panel DP includes a quantum dot/well light emitting element will be mainly described.

The display layer DL may include a first area A1 and a second area A2. The second area A2 may be an area except the first area A1.

The flexible circuit board FPCB may be connected (or attached) to the display panel DP (or the display layer DL) by the chip-on-film COF. For example, a portion of the chip-on-film COF may be bent such that the flexible circuit board FPCB is located on a back surface of the display layer DL.

A portion of the chip-on-film COF may be disposed on (or connected to) the first area A1 of the display layer DL. The first area A1 may be an area in which the first coupling layer 120 is disposed. The second area A2 may be an area in which the overcoat layer OC is disposed.

In some embodiments, the chip-on-film COF may be provided in plurality (see FIG. 4). For example, the chip-on-film COF may be provided in plurality, so that each of the chip-on-films COF is connected to the first coupling layer 120. Accordingly, in a partial area, the first coupling layer 120, the second coupling layer 140, and the chip-on-film COF may overlap each other in a plan view. In another area, the first coupling layer 120 and the second coupling layer 140 may overlap each other without overlapping the chip-on-film COF in a plan view.

In some embodiments, the first coupling layer 120, the second coupling layer 140, the chip-on-film COF, and the chassis CHAS may overlap each other in first area A1 in a plan view.

The overcoat layer OC may be disposed on the display layer DL. The overcoat layer OC may cancel a step difference caused by individual components disposed in the display layer DL. In accordance with an embodiment, the overcoat layer OC may overlap the second area A2.

The outer film layer UFL may be disposed on the overcoat layer OC. The outer film layer UFL may be disposed at an outer surface of the display panel DP (or a layer adjacent to the outer surface) to protect individual components of the display panel DP. In accordance with an embodiment, the outer film layer UFL may not overlap the first area A1 in a plan view. The outer film layer UFL may overlap the second area A2.

The display layer DL, the overcoat layer OC, and the outer film layer UFL will be described in detail later with reference to FIGS. 5 to 7.

The first coupling layer 120 may be disposed in the first area A1. A surface of the first coupling layer 120 may contact the display layer DL, at least a portion of another surface of the first coupling layer 120 may contact the chip-on-film COF. In some embodiments, a portion of the another surface of the first coupling layer 120 may contact the second coupling layer 140. The first coupling layer 120 and the overcoat layer OC may be disposed in a same layer.

The first coupling layer 120 may connect the display layer DL and the chip-on-film COF to each other. For example, in case that a temperature in a range (e.g., a predetermined or selectable range) is provided, the first coupling layer 120 may be cured to connect adjacent components to each other. A process procedure of the first coupling layer 120 will be described in detail later.

The first coupling layer 120 may include a conductive material. The first coupling layer 120 includes the conductive material, thereby electrically connecting a line of the display layer DL and the chip-on-film COF to each other. For example, the first coupling layer 120 may include a resin material including a conductive ball. The resin material may be one of epoxy resin and acrylic resin. However, the disclosure is not limited to the above-described example. The resin material may include one of various resin materials.

In accordance with an embodiment, the first coupling layer 120 may be designated as an anisotropic conductive film.

The second coupling layer 140 may be adjacent to the chassis CHAS. In a plan view, a portion of the second coupling layer 140 may overlap the first area A1, and another portion of the second coupling layer 140 may overlap the second area A2. The second coupling layer 140 may be disposed on the chip-on-film COF. In some embodiments, the second coupling layer 140 may be disposed on the overcoat layer OC and the first coupling layer 120. A surface of the second coupling layer 140 may contact the chassis CHAS. Another surface of the second coupling layer 140 may contact one of the chip-on-film COF, the first coupling layer 120, and the overcoat layer OC. In some embodiments, a portion of the second coupling layer 140 and the outer film layer UFL may be disposed in (or on) a same layer.

The second coupling layer 140 may connect the chassis CHAS to a position (e.g., a predetermined or selectable position). The second coupling layer 140 may allow the chassis CHAS to be disposed adjacent to the first area A1. The second coupling layer 140 may connect the chassis CHAS to the chip-on-film COF, the first coupling layer 120, and the overcoat layer OC. For example, in case that a temperature in a range (e.g., a predetermined or selectable range) is provided, the second coupling layer 140 may be cured to connect adjacent components to each other. A process procedure of the second coupling layer 140 will be described in detail later.

The second coupling layer 140 may not include any conductive material. The second coupling layer 140 may include a resin material. For example, the resin material may be one of epoxy resin and acrylic resin. However, the disclosure is not limited to the above-described example. The resin material may include one of various resin materials.

The second coupling layer 140 does not include any conductive material, so that an electrical signal provided to the display layer DL from the chip-on-film COF through the first coupling layer 120 can be prevented from being distorted, even in case that the chassis CHAS includes a conductive material.

In accordance with an embodiment, the second coupling layer 140 may be designated as a non-conductive film.

The first coupling layer 120 and the second coupling layer 140 are disposed at a side of the display device DD while allowing components to be coupled to each other. Thus, the first coupling layer 120 and the second coupling layer 140 can reduce influence of dust and moisture on the display device DD.

The chassis CHAS may be disposed on the second coupling layer 140. A surface of the chassis CHAS may contact the second coupling layer 140.

The chassis CHAS may overlap the first area A1 in a plan view. In a plan view, the chassis CHAS may overlap the first coupling layer 120, the chip-on-film COF, and the second coupling layer 140 in the first area A1.

In accordance with an embodiment, the display device DD may include sides, and the chassis CHAS may be disposed adjacent to one of the sides. For example, the chassis CHAS may be disposed adjacent to a side at which the driving circuit board DCB is disposed.

The chassis CHAS may include a metal material. For example, the chassis CHAS may include an alloy including aluminum (Al) and magnesium (Mg). The chassis CHAS may be disposed at a side of the display device DD to allow components adjacent to an outer surface of the display device DD not to be observed from the outside, thereby improving aesthetic impression of the display device DD.

The chassis CHAS may have a shape extending in one direction. For example, the chassis CHAS may have a flat plate shape including no bending area.

In accordance with an embodiment, a thickness of the chassis CHAS may be about 20 μm or more and about 100 μm or less.

The chassis CHAS may be collectively disposed together with the chip-on-film COF by a same process. Accordingly, sufficient process performance can be ensured even in case that the thickness of the chassis CHAS is small. For example, in accordance with a conventional art, the chassis CHAS had a bent shape, and the arrangement of the chassis CHAS was conducted in a manner that a portion of the chassis CHAS was put on an adjacent layer having a greater thickness (e.g., an upper substrate). Accordingly, in the conventional art, a minimum thickness was required in the chassis CHAS. However, in accordance with the embodiment of the disclosure, since the chassis CHAS is collectively provided together with the chip-on-film COF by using the first coupling layer 120 and the second coupling layer 140, the chassis CHAS can be disposed, which has a plate shape while having a sufficiently small thickness. As a result, process performance can be improved, process cost can be reduced, and the display device DD can become light in weight.

Hereinafter, a detailed structure of the display layer DL in accordance with an embodiment of the disclosure will be described with reference to FIGS. 5 to 7. In FIGS. 5 to 7, descriptions of portions overlapping those described above will be simplified or omitted.

Figure 5:
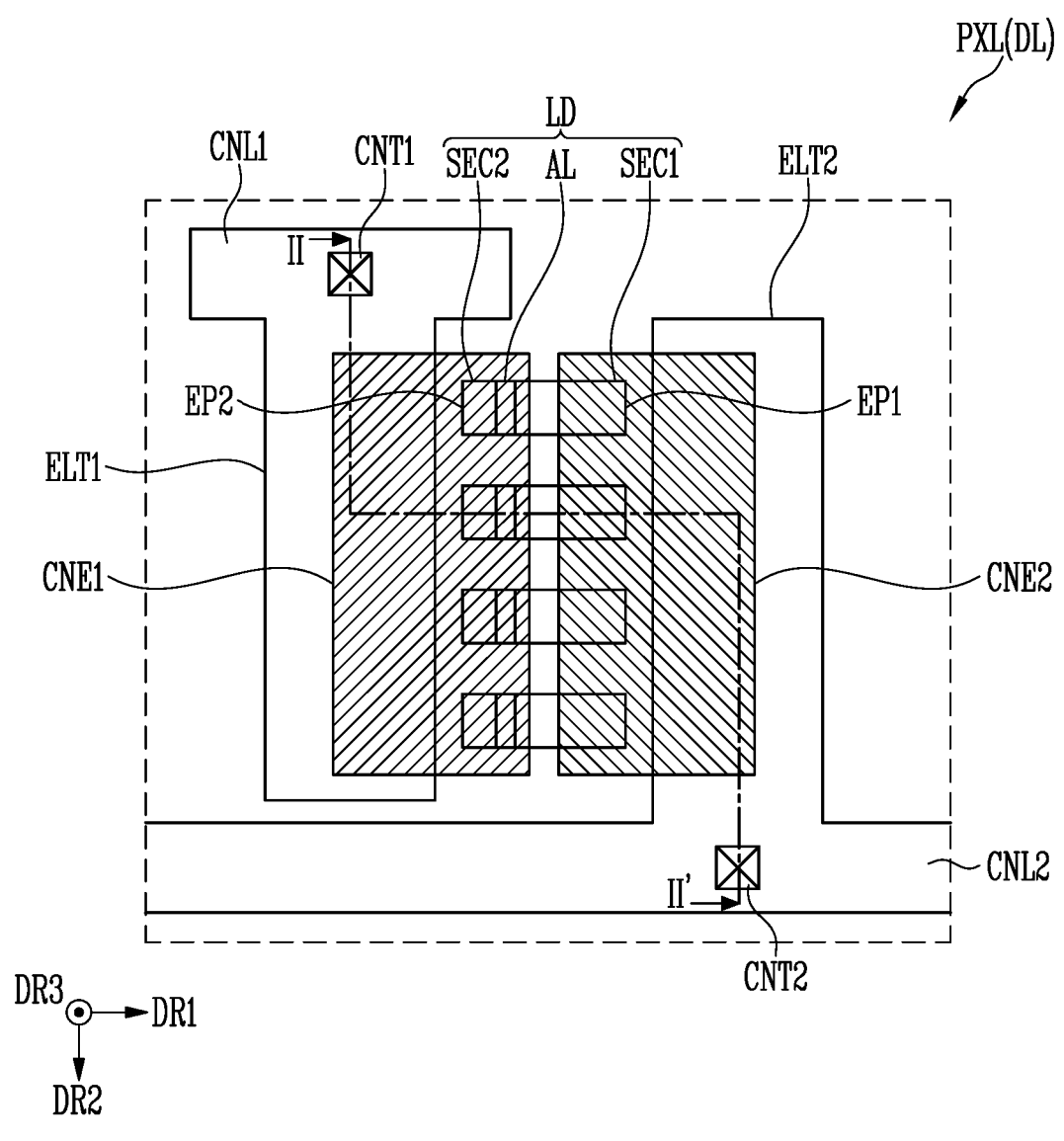
FIG. 5 is a schematic plan view schematically illustrating a pixel in accordance with an embodiment of the disclosure.

FIG. 5 is a plan view schematically illustrating a pixel in accordance with an embodiment of the disclosure. FIG. 5 illustrates a pixel PXL included in the display layer DL in accordance with an embodiment of the disclosure.

Referring to FIG. 5, the pixel PXL may include a first electrode ELT1, a second electrode ELT2, a first connection electrode CNL1, a second connection electrode CNL2, a first contact part CNT1, a second contact part CNT2, a light emitting element LD, a first contact electrode CNE1, and a second contact electrode CNE2.

The light emitting element LD may include a first semiconductor layer SEC1, a second semiconductor layer SEC2, and an active layer AL interposed (or disposed) between the first semiconductor layer SEC1 and the second semiconductor layer SEC2.

The light emitting element LD may have a first end portion EP1 and a second end portion EP2. The first semiconductor layer SEC1 may be adjacent to the first end portion EP1 of the light emitting element LD. The second semiconductor layer SEC2 may be adjacent to the second end portion EP2 of the light emitting element LD.

In accordance with an embodiment, the light emitting element LD may have a pillar shape. The pillar shape may mean a shape extending in a length direction of the light emitting element LD, such as a cylinder or a polyprism. For example, a length of the light emitting element LD may be greater than a diameter (or a width of a cross-sectional surface) of the light emitting element LD. The shape of a section of the light emitting element LD may include a rod-like shape and a bar-like shape, but the disclosure is not limited thereto.

The light emitting element LD may have a size of nanometer scale to micrometer scale.

The first semiconductor layer SEC1 may be a first conductivity type semiconductor layer. For example, the first semiconductor layer SEC1 may include an N-type semiconductor layer. For example, the first semiconductor layer SEC1 may include any one semiconductor material among InAlGaN, GaN, AlGaN, InGaN, AlN, and InN, and include an N-type semiconductor layer doped with a first conductivity type dopant such as Si, Ge, or Sn. However, the material forming the first semiconductor layer SEC1 is not limited thereto. The first semiconductor layer SEC1 may be formed (or configured) of various materials.

The active layer AL may be disposed on the first semiconductor layer SEC1. The active layer AL may be disposed between the first semiconductor layer SEC1 and the second semiconductor layer SEC2.

The active layer AL may include at least one of AlGaInP, AlGaInP, AlInGaN, InGaN, AlGaN, and the like. For example, in case that the active layer AL outputs red light, the active layer AL may include AlGaInP and/or InGaN. In case that the active layer AL outputs green light or blue light, the active layer AL may include InGaN. However, the disclosure is not limited to the above-described example.

The active layer AL may be formed in a single-quantum well structure or a multi-quantum well structure.

The second semiconductor layer SEC2 is disposed on the active layer AL, and may include a semiconductor layer having a type different from the type of the first semiconductor layer SEC1. For example, the second semiconductor layer SEC2 may include a P-type semiconductor layer. For example, the second semiconductor layer SEC2 may include at least one semiconductor material among InAlGaN, GaN, AlGaN, InGaN, AlN, and InN, and include a P-type semiconductor layer doped with a second conductivity type dopant such as Mg. However, the material forming (or constituting) the second semiconductor layer SEC2 is not limited thereto. The second semiconductor layer SEC2 may be configured with various materials.

In case that a threshold voltage or more is applied to ends of the light emitting element LD, the light emitting element LD may emit light while electron-hole pairs are combined in the active layer AL.

In some embodiments, the light emitting element LD may further include an element insulative film provided on a surface thereof. The element insulative film may be formed as a single film or films. The element insulative film may expose the ends portions of the light emitting element LD, which have different polarities.

In accordance with an embodiment, the element insulative film may include at least one insulating material among silicon oxide ($SiO_x$), silicon nitride ($SiN_x$), silicon oxynitride ($SiO_xN_y$), aluminum oxide ($AlO_x$), titanium oxide ($TiO_x$), and the like. However, the disclosure is not limited to a specific example.

In accordance with an embodiment, the light emitting element LD may further include an additional component in addition to the first semiconductor layer SEC1, the active layer AL, and the second semiconductor layer SEC2. For example, the light emitting elements LD may further include a phosphor layer, an active layer, a semiconductor layer, and/or an electrode layer.

The light emitting element LD may be provided in plurality to be arranged. For example, the light emitting elements LD may be arranged in a parallel structure in the second direction DR2. However, the arrangement structure of the light emitting element LD is not limited thereto.

The light emitting element LD may be disposed between electrodes configured to serve as alignment electrodes. For example, the light emitting element LD may be disposed between the first electrode ELT1 and the second electrode ELT2. The light emitting element LD may be disposed on the first electrode ELT1 and the second electrode ELT2. At least a portion of the light emitting element LD may be disposed between the first electrode ELT1 and the second electrode ELT2 in a plan view.

The light emitting element LD may be electrically connected to the first electrode ELT1 through the first contact electrode CNE1.

In accordance with an embodiment, the second end portion EP2 of the light emitting element LD may be electrically connected to the first contact electrode CNE1. Accordingly, the second semiconductor layer SEC2 of the light emitting element LD may be electrically connected to the first electrode ELT1 and the first contact electrode CNE1.

The light emitting element LD may be electrically connected to the second electrode ELT2 through the second contact electrode CNE2.

In accordance with an embodiment, the first end portion EP1 of the light emitting element LD may be electrically connected to the second contact electrode CNE2. Accordingly, the first semiconductor layer SEC of the light emitting element LD may be electrically connected to the second electrode ELT2 and the second contact electrode CNE2.

The first electrode ELT1 may extend in the second direction DR2. The first electrode ELT1 may be spaced apart from the second electrode ELT2 in the first direction DR1. The first electrode ELT1 may be connected to the first connection electrode CNL1. The first direction DR1 may be different from the second direction DR2.

The first connection electrode CNL1 may be connected to a bridge pattern BRP (see FIG. 6) included in a pixel circuit layer PCL (see FIG. 6) through the first contact part CNT1. The first connection electrode CNL1 and the first electrode ELT1 may be disposed in a same layer, so that the first connection electrode CNL1 and the first electrode ELT1 are integral with each other.

The second electrode ELT2 may extend in the second direction DR2. The second electrode ELT2 may be spaced apart from the first electrode ELT1 in the first direction DR1. The second electrode ELT2 may be connected to the second connection electrode CNL2.

The second connection electrode CNL2 may be connected to a power line PL (see FIG. 6) included in the pixel circuit layer PCL through the second contact part CNT2. The second connection electrode CNL2 and the second electrode ELT2 may be disposed in (or on) a same layer, so that the second connection electrode CNL2 and the second electrode ELT2 are integrally formed (or integral with each other).

The first contact electrode CNE1 may be disposed on the first electrode ELT1 to be electrically connected to the first electrode ELT1. The first contact electrode CNE1 may electrically connect the first electrode ELT1 and the light emitting element LD to each other.

The second contact electrode CNE2 may be disposed on the second electrode ELT2 to be electrically connected to the second electrode ELT2. The second contact electrode CNE2 may electrically connect the second electrode ELT2 and the light emitting element LD to each other.

Hereinafter, a sectional structure of the pixel PXL in accordance with an embodiment of the disclosure will be mainly described with reference to FIGS. 6 and 7. FIG. 6 is a schematic view illustrating a display layer DL in accordance with an embodiment of the disclosure, and schematically illustrates a section of the pixel PXL. FIG. 7 is a schematic view illustrating a display panel DP including a display layer DL in accordance with an embodiment of the disclosure, and schematically illustrates a section of the pixel PXL.

Figure 6:
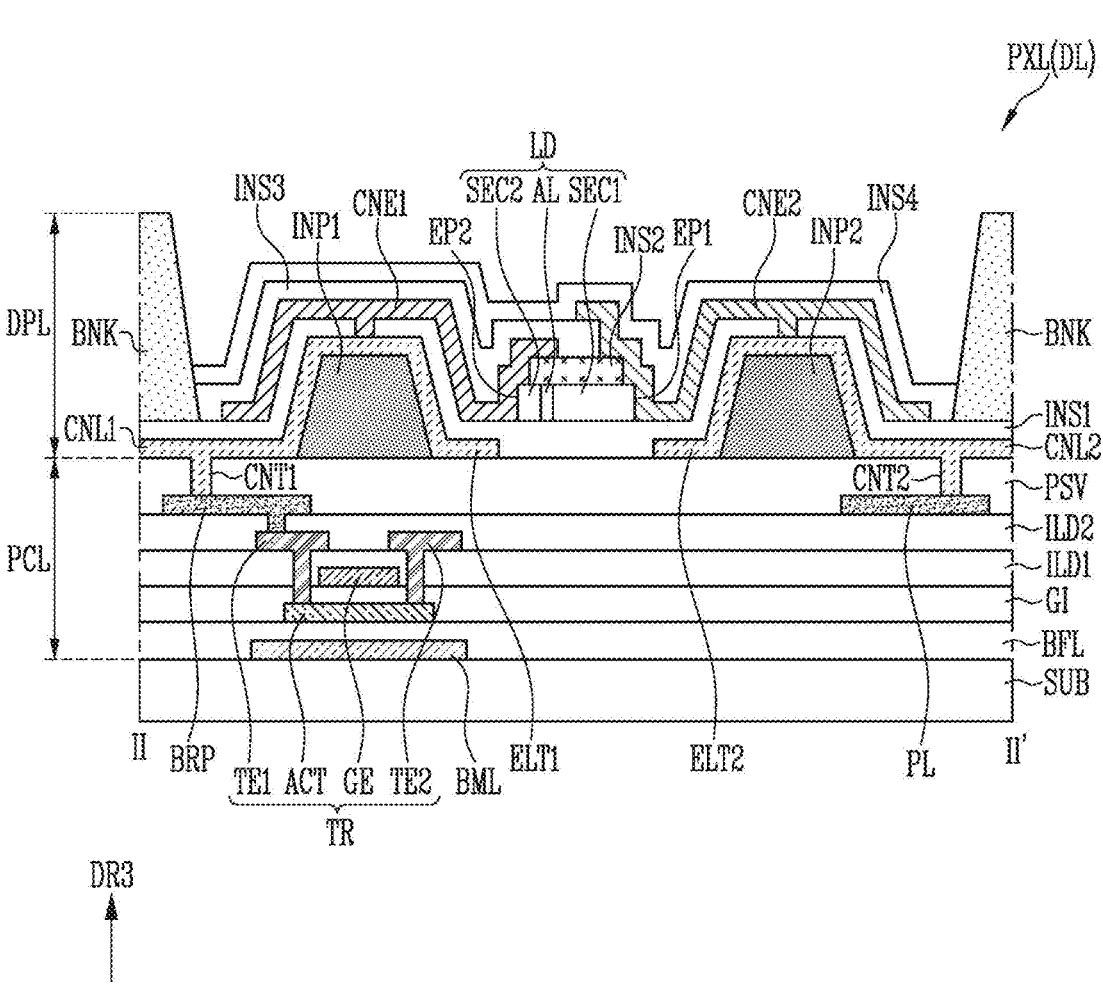
FIG. 6 is a schematic cross-sectional view taken along line II-II' shown in FIG. 5.

FIG. 6 is a schematic sectional view taken along line II-II' shown in FIG. 5. FIG. 7 is a schematic sectional view taken along line III-III' shown in FIG. 2.

Referring to FIG. 6, the display layer DL (or the pixel PXL) may include a substrate SUB, a pixel circuit layer PCL, and a display element layer DPL.

The substrate SUB may constitute a base member of the display device DD. The substrate SUB may be a rigid or flexible substrate or film, but the disclosure is not limited to a specific example. The substrate SUB may be provided as a base surface, so that the pixel circuit layer PCL and the display element layer DPL are disposed on the substrate SUB.

The pixel circuit layer PCL may be disposed on the substrate SUB. The pixel circuit layer PCL may include a lower electrode layer BML, a buffer layer BFL, a transistor TR, a gate insulating layer GI, a first interlayer insulating layer ILD1, a second interlayer insulating layer ILD2, a bridge pattern BRP, a power line PL, a protective layer PSV, a first contact part CNT1, and a second contact part CNT2.

The lower electrode layer BML may be disposed on the substrate SUB to be covered by the buffer layer BFL. A portion of the lower electrode layer BML may overlap the transistor TR in a plan view.

In accordance with an embodiment, the lower electrode layer BML may include a conductive material, thereby serving as a path through which an electrical signal provided to the pixel circuit layer PCL and the display element layer DPL moves. For example, the lower electrode layer BML may include at least one of aluminum (Al), copper (Cu), titanium (Ti), molybdenum (Mo), and the like.

The buffer layer BFL may be located on the substrate SUB. The buffer layer BFL may prevent an impurity from being diffused from the outside. The buffer layer BFL may include at least one of silicon nitride ($SiN_x$), silicon oxide ($SiO_x$), silicon oxynitride ($SiO_xN_y$), metal oxide such as aluminum oxide ($AlO_x$), and the like.

The transistor TR may be a thin film transistor. In accordance with an embodiment, the transistor TR may be a driving transistor.

The transistor TR may be electrically connected to a light emitting element LD. The transistor TR may be electrically connected to the bridge pattern BRP. However, the disclosure is not limited to the above-described example. In an example, the transistor TR may be electrically connected to a first connection electrode CNL1 without passing through the bridge pattern BRP.

The transistor TR may include an active layer ACT, a first transistor electrode TE1, a second transistor electrode TE2, and a gate electrode GE.

The active layer ACT may mean a semiconductor layer. The active layer ACT may be disposed on the buffer layer BFL. The active layer ACT may include one of low-temperature polycrystalline silicon (LTPS), poly-silicon, amorphous silicon, and an oxide semiconductor.

The active layer ACT may include a first contact region contacting the first transistor electrode TE1 and a second contact region contacting the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active layer ACT. For example, the gate electrode GE may be disposed on the channel region of the active layer ACT with the gate insulating layer GI interposed therebetween. In an example, the gate electrode GE may include at least one of aluminum (Al), copper (Cu), titanium (Ti), molybdenum (Mo), and the like.

The gate insulating layer GI may be disposed over the active layer ACT. The gate insulating layer GI may include an inorganic material. In an example, the gate insulating layer GI may include at least one of silicon nitride ($SiN_x$), silicon oxide ($SiO_x$), silicon oxynitride ($SiO_xN_y$), aluminum oxide ($AlO_x$), and the like.

The first interlayer insulating layer ILD1 may be located over the gate electrode GE. Similar to the gate insulating layer GI, the first interlayer insulating layer ILD1 may include at least one of silicon nitride ($SiN_x$), silicon oxide ($SiO_x$), silicon oxynitride ($SiO_xN_y$), aluminum oxide ($AlO_x$), and the like.

The first transistor electrode TE1 and the second transistor electrode TE2 may be located on the first interlayer insulating layer ILD1. The first transistor electrode TE1 may contact the first contact region of the active layer ACT while penetrating the gate insulating layer GI and the first interlayer insulating layer ILD1, and the second transistor electrode TE2 may contact the second contact region of the active layer ACT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The second interlayer insulating layer ILD2 may be located over the first transistor electrode TE1 and the second transistor electrode TE2. Similar to the first interlayer insulating layer ILD1 and the gate insulating layer GI, the second interlayer insulating layer ILD2 may include an inorganic material. The inorganic material may include at least one of the materials that may be used to form the first interlayer insulating layer ILD1 and the gate insulating layer GI, e.g., silicon nitride ($SiN_x$), silicon oxide ($SiO_x$), silicon oxynitride ($SiO_xN_y$), aluminum oxide ($AlO_x$), and the like.

The bridge pattern BRP may be disposed on the second interlayer insulating layer ILD2. The bridge pattern BRP may be connected to the first transistor electrode TE1 through a contact hole penetrating the second interlayer insulating layer ILD2. The bridge pattern BRP may be electrically connected to the first connection electrode CNL1 through the first contact part CNT1 formed in the protective layer PSV.

The power line PL may be disposed on the second interlayer insulating layer ILD2. The power line PL may be electrically connected to a second connection electrode CNL2 through the second contact part CNT2 formed in the protective layer PSV. The power line PL may provide a power source (or cathode signal) to the light emitting element LD through a second electrode ELT2.

The protective layer PSV may be located on the second interlayer insulating layer ILD2. The protective layer PSV may cover the bridge pattern BRP and the power line PL. The protective layer PSV may be a via layer.

In accordance with an embodiment, the protective layer PSV may include an organic insulating layer, an inorganic insulating layer, or the organic insulating layer disposed on the inorganic insulating layer, but the disclosure is not limited thereto.

In accordance with an embodiment, the first contact part CNT1 connected to a region of the bridge pattern BRP and the second contact part CNT2 connected to a region of the power line PL may be formed in the protective layer PSV.

The display element layer DPL may be disposed on the pixel circuit layer PCL. The display element layer DPL may include a first insulating pattern INP1, a second insulating pattern INP2, a bank BNK, the first connection electrode CNL1, the second connection electrode CNL2, a first electrode ELT1, the second electrode ELT2, a first insulating layer INS1, the light emitting element LD, a second insulating layer INS2, a first contact electrode CNE1, a second contact electrode CNE2, a third insulating layer INS3, and a fourth insulating layer INS4.

The first insulating pattern INP1 and the second insulating pattern INP2 may be disposed on the protective layer PSV. The first insulating pattern INP1 and the second insulating pattern INP2 may have a shape protruding in the display direction of the display device (e.g., the third direction DR3). In an example, the first insulating pattern INP1 and the second insulating pattern INP2 may include an organic material and/or an inorganic material, but the disclosure is not limited thereto.

The bank BNK may be disposed on the first insulating layer INS1. The bank BNK may have a shape protruding in the display direction of the display device (e.g., the third direction DR3). The bank BNK may define a space in which an ink can be accommodated during an inkjet process for disposing the light emitting element LD.

The first connection electrode CNL1 and the second connection electrode CNL2 may be disposed on the protective layer PSV. The first connection electrode CNL1 may be connected to the first electrode ELT1. The first connection electrode CNL1 may be electrically connected to the bridge pattern BRP through the first contact part CNT1. The first connection electrode CNL1 may electrically connect the bridge pattern BRP and the first electrode ELT1 to each other. The second connection electrode CNL2 may be connected to the second electrode ELT2. The second connection electrode CNL2 may be electrically connected to the power line PL through the second contact part CNT2. The second connection electrode CNL2 may electrically connect the power line PL and the second electrode ELT2 to each other.

The first electrode ELT1 and the second electrode ELT2 may be disposed on the protective layer PSV. In accordance with an embodiment, at least a portion of the first electrode ELT1 may be arranged over the first insulating pattern INP1, and at least a portion of the second electrode ELT2 may be arranged over the second insulating pattern INP2, to each serve as a reflective partition wall.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. For example, the first electrode ELT1 and the second electrode ELT2 may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and the like, and alloys thereof. However, the disclosure is not limited to the above-described example.

In accordance with an embodiment, the first electrode ELT1 and the second electrode ELT2 may serve as alignment electrodes for the light emitting element LD. For example, the light emitting element LD may be arranged based on an electrical signal provided from the first electrode ELT1 and the second electrode ELT2.

The first insulating layer INS1 may be disposed on the protective layer PSV. The first insulating layer INS may cover the first electrode ELT1 and the second electrode ELT2. The first insulating layer INS1 may stabilize connection between electrode components, and reduce external influence. The first insulating layer INS1 may include at least one of silicon oxide ($SiO_x$), silicon nitride ($SiN_x$), silicon oxynitride ($SiO_xN_y$), aluminum oxide ($AlO_x$), and the like.

The light emitting element LD may be disposed on the first insulating layer INS1 to emit light based on an electrical signal provided from the first contact electrode CNE1 and the second contact electrode CNE2.

The second insulating layer INS2 may be disposed on the light emitting element LD. The second insulating layer INS2 may cover the active layer AL of the light emitting element LD. In an example, the second insulating layer INS2 may include at least one of an organic material and an inorganic material.

The first contact electrode CNE1 and the second contact electrode CNE2 may be disposed on the first insulating layer INS1. The first contact electrodes CNE1 may electrically connect the first electrode ELT1 and the light emitting element LD to each other, and the second contact electrode CNE2 may electrically connect the second electrode ELT2 and the light emitting element LD to each other.

In accordance with an embodiment, the first contact electrode CNE1 may provide an anode signal to the light emitting element LD, and the second contact electrode CNE2 may provide a cathode signal to the light emitting element LD.

The first contact electrode CNE1 and the second contact electrode CNE2 may include a conductive material. In an example, the first contact electrode CNE1 and the second contact electrode CNE2 may include a transparent conductive material including indium tin oxide (ITO), indium zinc oxide (IZO), and indium tin zinc oxide (ITZO), but the disclosure is not limited thereto.

The third insulating layer INS3 may be disposed over the first contact electrode CNE1. The third insulating layer INS3 may include at least one of the materials that may be used to form the first insulating layer INS1, e.g., as discussed herein. In accordance with an embodiment of the disclosure, a portion of the third insulating layer INS3 may be disposed between the first contact electrode CNE1 and the second contact electrode CNE2 to prevent the first contact electrode CNE1 and the second contact electrode CNE2 from being electrically short-circuited to each other.

The fourth insulating layer INS4 may be disposed on the first contact electrode CNE1, the second contact electrode CNE2, and the third insulating layer INS3. The fourth insulating layer INS4 may protect individual components of the display element layer DPL. In an example, the fourth insulating layer INS4 may include at least one of silicon oxide ($SiO_x$), silicon nitride ($SiN_x$), silicon oxynitride ($SiO_xN_y$), aluminum oxide ($AlO_x$), and the like.

Layers included in the pixel PXL in accordance with an embodiment of the disclosure will be described with reference to FIG. 7. For convenience of description, FIG. 7 schematically illustrates individual components of the pixel circuit layer PCL and the display element layer DPL.

Figure 7:
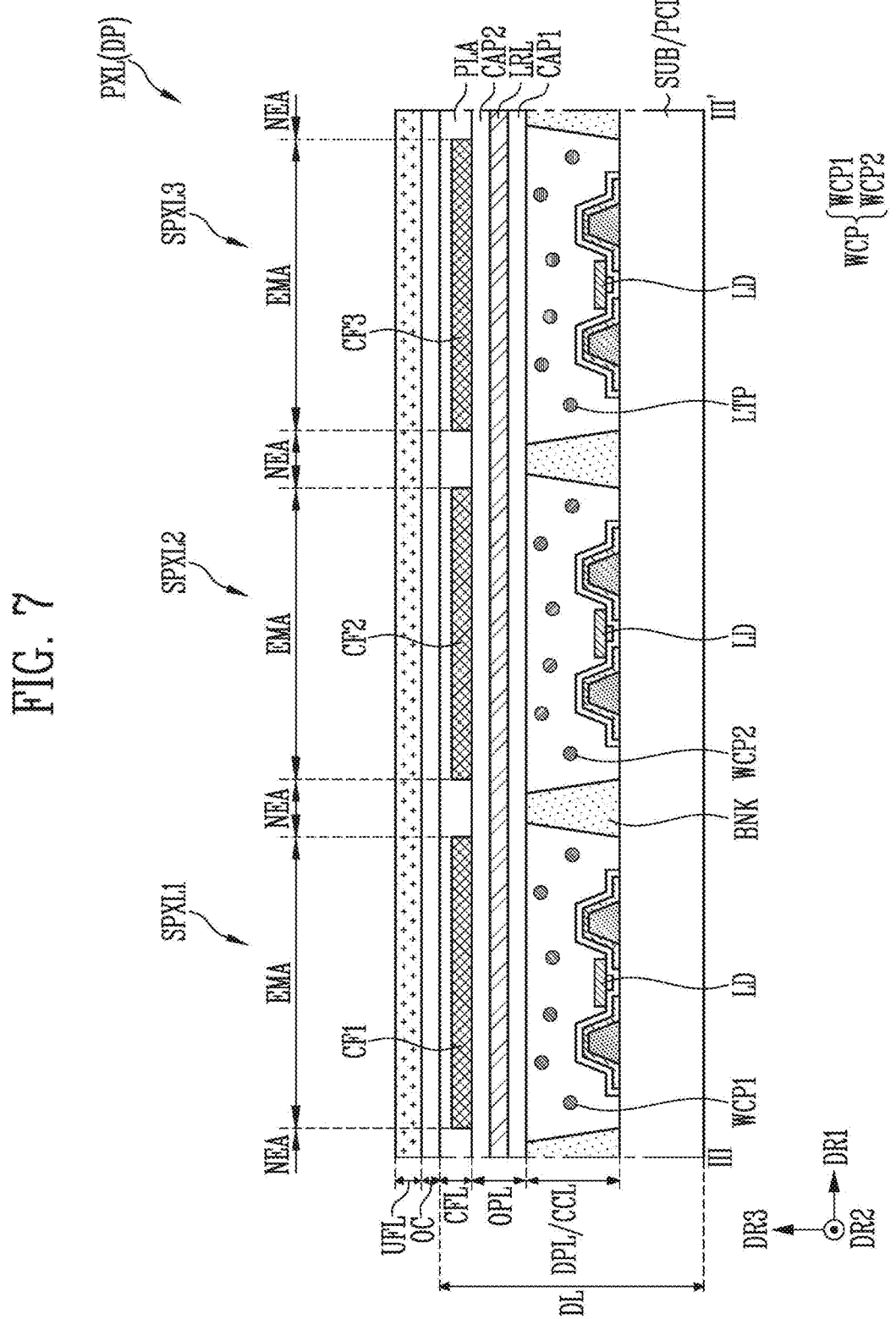
FIG. 7 is a schematic cross-sectional view taken along line III-III' shown in FIG. 2.

Referring to FIG. 7, the display layer DL (or the pixel PXL) may further include a color conversion layer CCL, an optical layer OPL, and a color filter layer CFL. The display layer DL (or the pixel PXL) may further include an overcoat layer OC and an outer film layer UFL, which are disposed on the display layer DL.

In accordance with an embodiment, light emitting elements LD disposed in each of the first sub-pixel SPXL1, the second sub-pixel SPXL2, and the third sub-pixel SPXL3 may emit light of a same color. For example, the first sub-pixel SPXL1, the second sub-pixel SPXL2, and the third sub-pixel SPXL3 may include light emitting elements LD emitting light of a third color, e.g., blue light. The color conversion layer CCL and/or the color filter layer CFL may be provided in the first sub-pixel SPXL1, the second sub-pixel SPXL2, and the third sub-pixel SPXL3 to display a full-color image. However, the disclosure is not limited thereto, and the first sub-pixel SPXL1, the second sub-pixel SPXL2, and the third sub-pixel SPXL3 may include light emitting elements LD emitting lights of different colors.

In accordance with an embodiment, the color conversion layer CCL and the display element layer DPL may be disposed in a same layer. For example, the color conversion layer CCL may be disposed between banks BNK.

The color conversion layer CCL may include a wavelength conversion pattern WCP and a light transmission pattern LTP. In an example, the wavelength conversion pattern WCP may include a first wavelength conversion pattern WCP1 and a second wavelength conversion pattern WCP2.

The first wavelength conversion pattern WCP1 may be disposed to overlap an emission area EMA of the first sub-pixel SPXL1. For example, the first wavelength conversion pattern WCP1 may be provided between banks BNK to overlap the emission area EMA of the first sub-pixel SPXL1 in a plan view.

The second wavelength conversion pattern WCP2 may be disposed to overlap an emission area EMA of the second sub-pixel SPXL2. For example, the second wavelength conversion pattern WCP2 may be provided between banks BNK to overlap the emission area EMA of the second sub-pixel SPXL2 in a plan view.

The light transmission pattern LTP may be disposed to overlap an emission area EMA of the third sub-pixel SPXL3. For example, the light transmission patter LTP may be provided between banks BNK to overlap the emission area EMA of the third sub-pixel SPXL3 in a plan view.

In accordance with an embodiment, the first wave conversion pattern WCP1 may include first color conversion particles for converting light of a third color, which is emitted from a light emitting element LD, into light of a first color. In an example, in case that the light emitting element LD is a blue light emitting element emitting light of blue, and the first sub-pixel SPXL1 is a red pixel, the first wavelength conversion pattern WCP1 may include a first quantum dot for converting light of blue, which is emitted from the blue light emitting element, into light of red.

For example, the first wavelength conversion pattern WCP1 may include first quantum dots dispersed in a matrix material such as base resin. The first quantum dot may absorb blue light and emit red light by shifting a wavelength of the blue light according to energy transition. In case that the first sub-pixel SPXL1 is a pixel of another color, the first wavelength conversion pattern WCP1 may include a first quantum dot corresponding to the color of the first sub-pixel SPXL1.

In accordance with an embodiment, the second wavelength conversion pattern WCP2 may include second color conversion particles for converting light of the third color, which is emitted from the light emitting element LD, into light of a second color. In an example, in case that the light emitting element LD is a blue light emitting element emitting light of blue, and the second sub-pixel SPXL2 is a green pixel, the second wavelength conversion pattern WCP2 may include a second quantum dot for converting light of blue, which is emitted from the blue light emitting element, into light of green.

For example, the second wavelength conversion pattern WCP2 may include second quantum dots dispersed in a matrix material such as base resin. The second quantum dot may absorb blue light and emit green light by shifting a wavelength of the blue light according to energy transition. In case that the second sub-pixel SPXL2 is a pixel of another color, the second wavelength conversion pattern WCP2 may include a second quantum dot corresponding to the color of the second sub-pixel SPXL2.

The first quantum dot and the second quantum dot may have shapes such as a spherical shape, a pyramid shape, a multi-arm shape, a cubic nanoparticle, a nanowire, a nanofabric, or a sheet-shaped nanoparticle. However, the disclosure is not limited thereto, and the shape of the first quantum dot and the second quantum dot may be variously changed.

In an embodiment, light of blue having a relatively short wavelength in a visible light band is incident into the first quantum dot and the second quantum dot, so that absorption coefficients of the first quantum dot and the second quantum dot can be increased. Accordingly, the efficiency of light finally emitted from the first sub-pixel SPXL1 and the second sub-pixel SPXL2 can be improved, and excellent color reproduction can be ensured. The pixel part of the first to third sub-pixels SPXL1, SPXL2, and SPXL3 is configured by using light emitting elements LD of a same color (e.g., blue light emitting elements), so that the manufacturing efficiency of the display device can be improved.

In accordance with an embodiment, the light transmission pattern LTP may be provided to efficiently use light of the third color emitted from the light emitting element LD. In an example, in case that the light emitting element LD is a blue light emitting element emitting light of blue, and the third sub-pixel SPXL3 is a blue pixel, the light transmission pattern LTP may include at least one kind of light scattering particles to efficiently use light emitted from the light emitting element LD.

For example, the light transmission pattern LTP may include light scattering particles dispersed in a matrix material such as base resin. In an example, the light transmission pattern LTP may include light scattering particles such as silica, but the material forming the light scattering particles is not limited thereto.

The light scattering particles are not to be disposed in only the emission area EMA of the third sub-pixel SPXL3. In an example, the light scattering particles may be selectively included even at the inside of the first wavelength conversion pattern WCP1 and/or the second wavelength conversion pattern WCP2.

The optical layer OPL may include a first capping layer CAP1, a low reflective layer LRL, and a second capping layer CAP2. The optical layer OPL may be disposed on the color conversion layer CCL. The optical layer OPL may be disposed on the display element layer DPL.

The first capping layer CAP1 may seal (or cover) the wave conversion pattern WCP and the light transmission pattern LTP. The first capping layer CAP1 may be disposed between the low refractive layer LRL and the display element layer DPL. The first capping layer CAP1 may be provided throughout the first to third sub-pixels SPXL1, SPXL2, and SPXL3. The first capping layer CAP1 may prevent the color conversion layer CCL from being damaged or contaminated due to infiltration of an impurity such as moisture or air from the outside.

In accordance with an embodiment, the first capping layer CAP1 may be formed as a single layer or a multi-layer including at least one insulating material among silicon oxide ($SiO_x$), silicon nitride ($SiN_x$), silicon oxynitride ($SiO_xN_y$), aluminum oxide ($AlO_x$), titanium oxide ($TiO_x$), and the like, but the disclosure is not limited thereto.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the first to third sub-pixels SPXL1, SPXL2, and SPXL3.

The low refractive layer LRL may function to allow light provided from the color conversion layer CCL to be recycled by total reflection, thereby improving light efficiency. To this end, the low refractive layer LRL may have a refractive index relatively lower than that of the color conversion layer CCL.

In accordance with an embodiment, the low refractive layer LRL may include a base resin and hollow particles dispersed in the base resin. The hollow particle may include a hollow silica particle. As another example, the hollow particle may be a pore formed by porogen, but the disclosure is not limited thereto. The low refractive layer LRL may include one of zinc oxide (ZnOx), a titanium oxide ($TiO_x$) particle, and a nanosilicate particle. However, the disclosure is not limited to the above-described example.

The second capping layer CAP2 may be disposed on the low refractive layer LRL. The second capping layer CAP2 may be disposed between the color filter layer CFL and the low refractive layer LRL. The second capping layer CAP2 may be provided throughout the first to third sub-pixels SPXL1, SPXL2, and SPXL3. The second capping layer CAP2 may prevent the low refractive layer LRL from being damaged or contaminated due to infiltration of an impurity such as moisture or air from the outside.

In accordance with an embodiment, the second capping layer CAP2 may be formed as a single layer or a multi-layer including at least one insulating material among silicon oxide ($SiO_x$), silicon nitride ($SiN_x$), silicon oxynitride ($SiO_xN_y$), aluminum oxide ($AlO_x$), titanium oxide ($TiO_x$), and the like, but the disclosure is not limited thereto.

The color filter layer CFL may be disposed on the second capping layer CAP2. The color filter layer CFL may be provided throughout the first to third sub-pixels SPXL1, SPXL2, and SPXL3. The color filter layer CFL may include color filters CF1, CF2, and CF3 and a planarization layer PLA.

In accordance with an embodiment, the color filters CF1, CF2, and CF3 may be disposed on the second capping layer CAP2. In a plan view, the color filters CF1, CF2, and CF3 may overlap the emission areas EMA of the first to third sub-pixels SPXL1, SPXL2, and SPXL3.

In accordance with an embodiment, a first color filter CF1 allows light of the first color to be transmitted therethrough, and may allow light of the second color and light of the third color not to be transmitted therethrough. For example, the first color filter CF1 may include a colorant of the first color.

In accordance with an embodiment, a second color filter CF2 allows light of the second color to be transmitted therethrough, and may allow light of the first color and light of the third color not to be transmitted therethrough. For example, the second color filter CF2 may include a colorant of the second color.

In accordance with an embodiment, a third color filter CF3 allows light of the third color to be transmitted therethrough, and may allow light of the first color and light of the second color not to be transmitted therethrough. For example, the third color filter CF3 may include a colorant of the third color.

In accordance with an embodiment, the planarization layer PLA may be provided over the color filters CF1, CF2, and CF3. The planarization layer PLA may cover the color filters CF1, CF2, and CF3. The planarization layer PLA may cancel a step difference occurring due to the color filters CF1, CF2, and CF3. The planarization layer PLA may be provided throughout the first to third sub-pixels SPXL1, SPXL2, and SPXL3.

In accordance with an embodiment, the planarization layer PLA may include an organic material such as acryl resin, epoxy resin, phenolic resin, polyamides resin, polyimides resin, polyesters resin, polyphenylene sulfides resin, or benzocyclobutene (BCB). However, the disclosure is not limited thereto, and the planarization layer PLA may include various kinds of inorganic insulating materials, e.g., including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), and the like.

The overcoat layer OC may be disposed on the planarization layer PLA. The overcoat layer OC may be disposed between the outer film layer UFL and the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may prevent moisture or air from infiltrating into the above-described lower member. The overcoat layer OC may protect the above-described lower member from a foreign matter such as dust.

In accordance with an embodiment, the overcoat layer OC may include an organic material such as acryl resin, epoxy resin, phenolic resin, polyamides resin, polyimides resin, polyesters resin, polyphenylene sulfides resin, or benzocyclobutene (BCB). However, the disclosure is not limited thereto, and the overcoat layer OC may include various kinds of inorganic insulating materials, e.g., including at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), and the like.

The outer film layer UFL may be disposed on the color filter layer CFL. The outer film layer UFL may be disposed at an outer portion of the display device DD to reduce external influence on the display device DD. The outer film layer UFL may be provided throughout the first to third sub-pixels SPXL1, SPXL2, and SPXL3.

In accordance with an embodiment, the outer film layer UFL may include an anti-reflective (AR) coating. The AR coating may mean a component formed by applying a material having an anti-reflection function to a surface of a specific component. The applied material may have a low reflexibility. In an example, the material used for the AR coating may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), and the like. However, the disclosure is not limited thereto, and various materials may be applied.

The structure of the pixel PXL is not limited to the above-described example. For example, in some embodiments, the color conversion layer CCL and the display element layer DPL may be disposed in (or on) different layers.

Hereinafter, a manufacturing method for the display device DD will be described with reference to FIGS. 8 to 13. In FIGS. 8 to 13, descriptions of portions overlapping those described above will be simplified or omitted.

Figure 8:
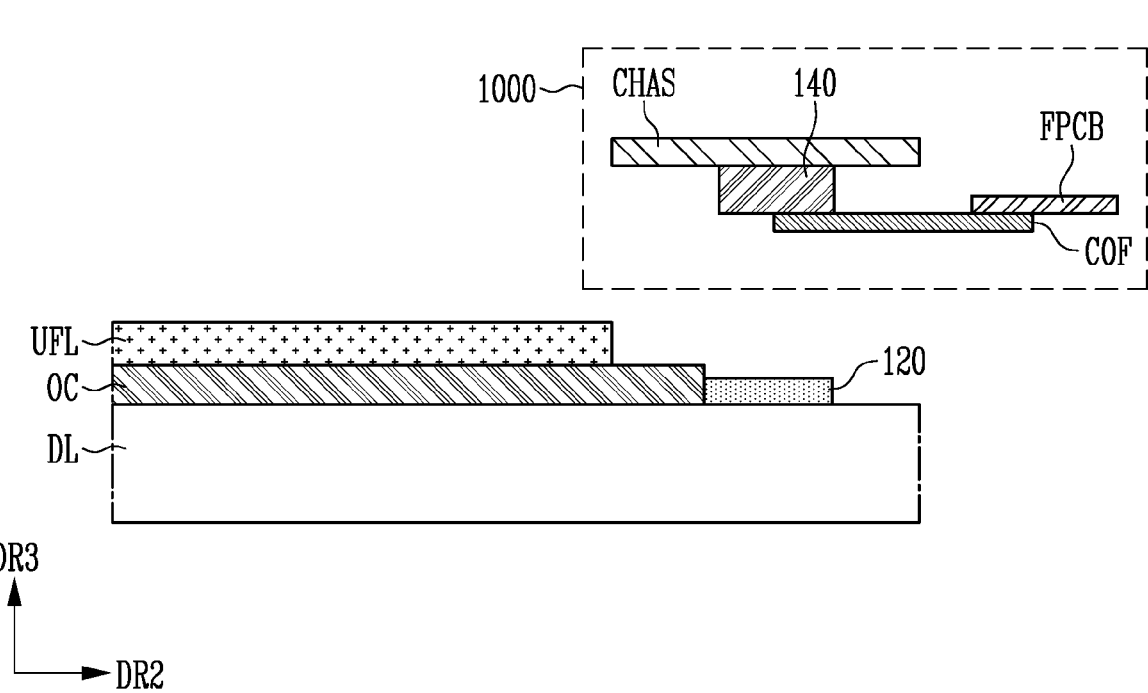
FIGS. 8 to 13 are schematic process cross-sectional views illustrating a manufacturing method for the display device in accordance with an embodiment of the disclosure.
Figure 9:
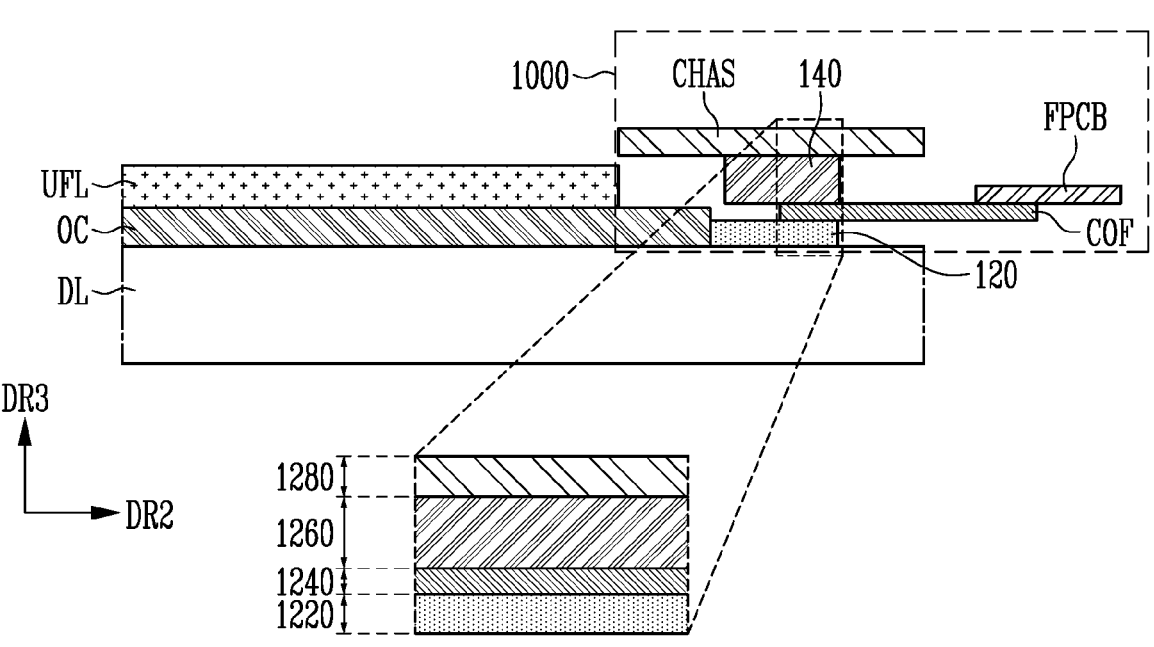
Figure 10:
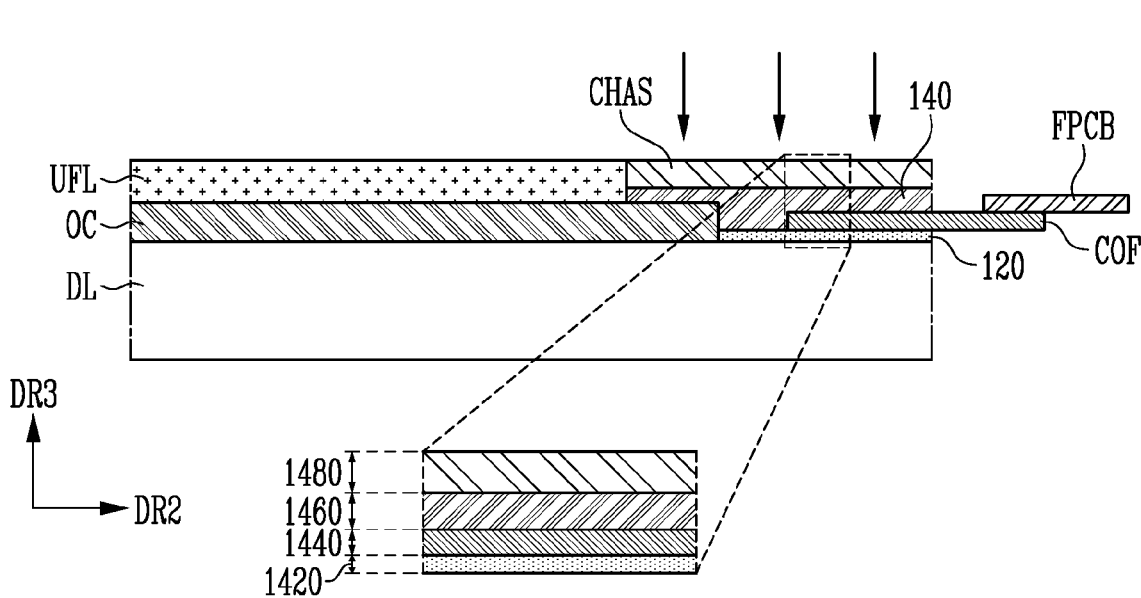
Figure 11:
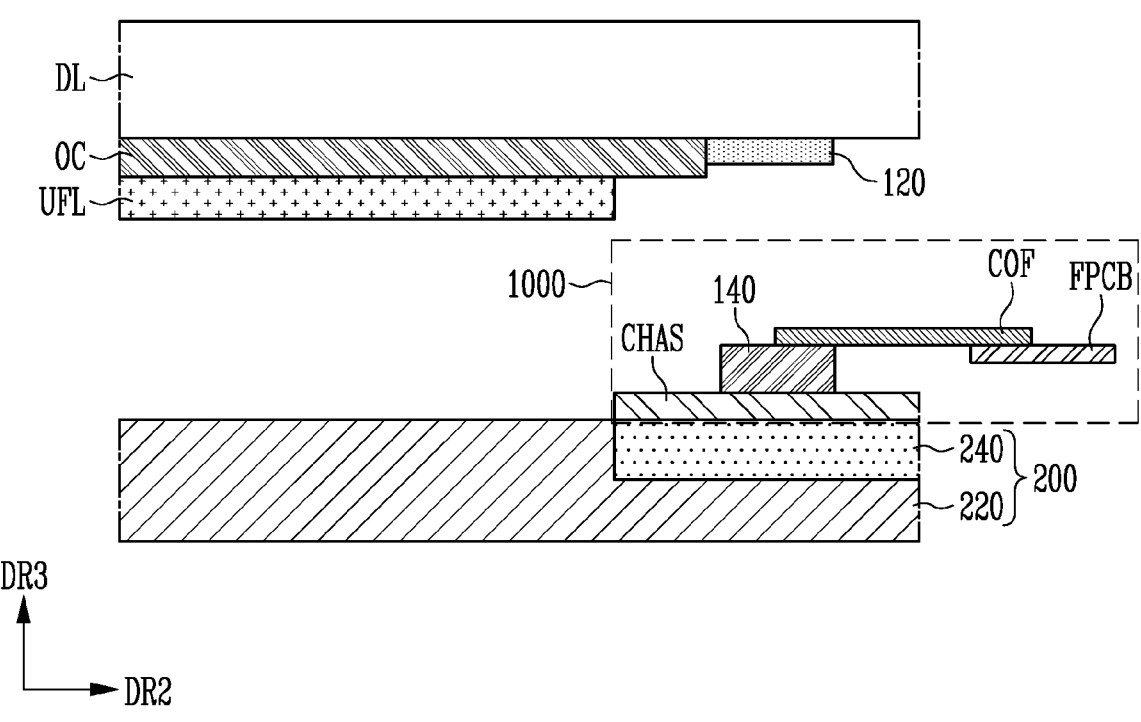
Figure 12:
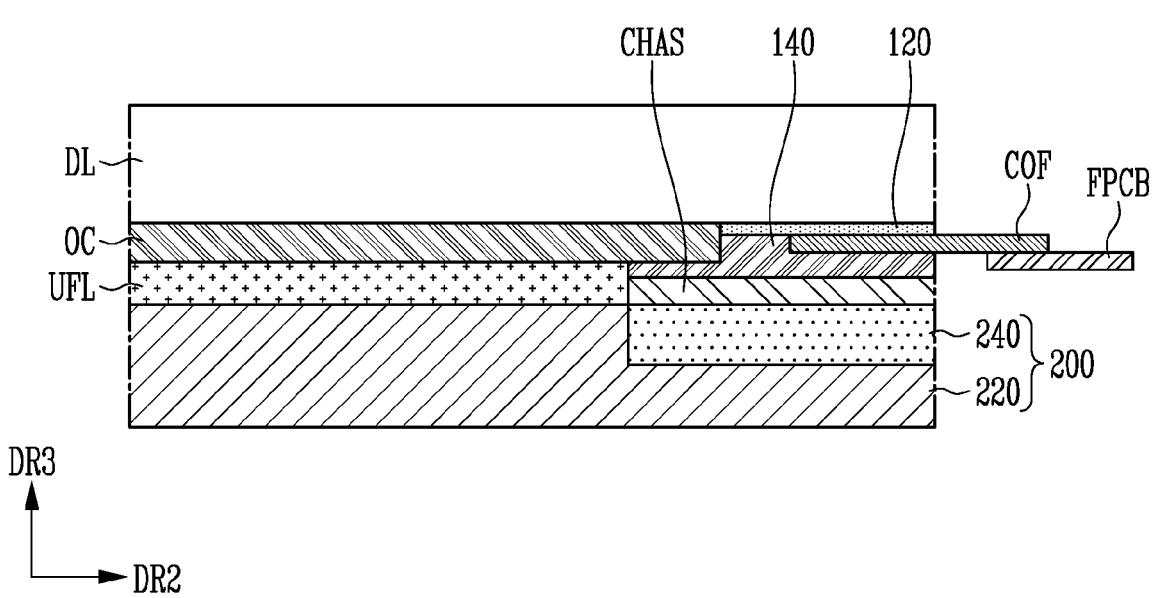
Figure 13:
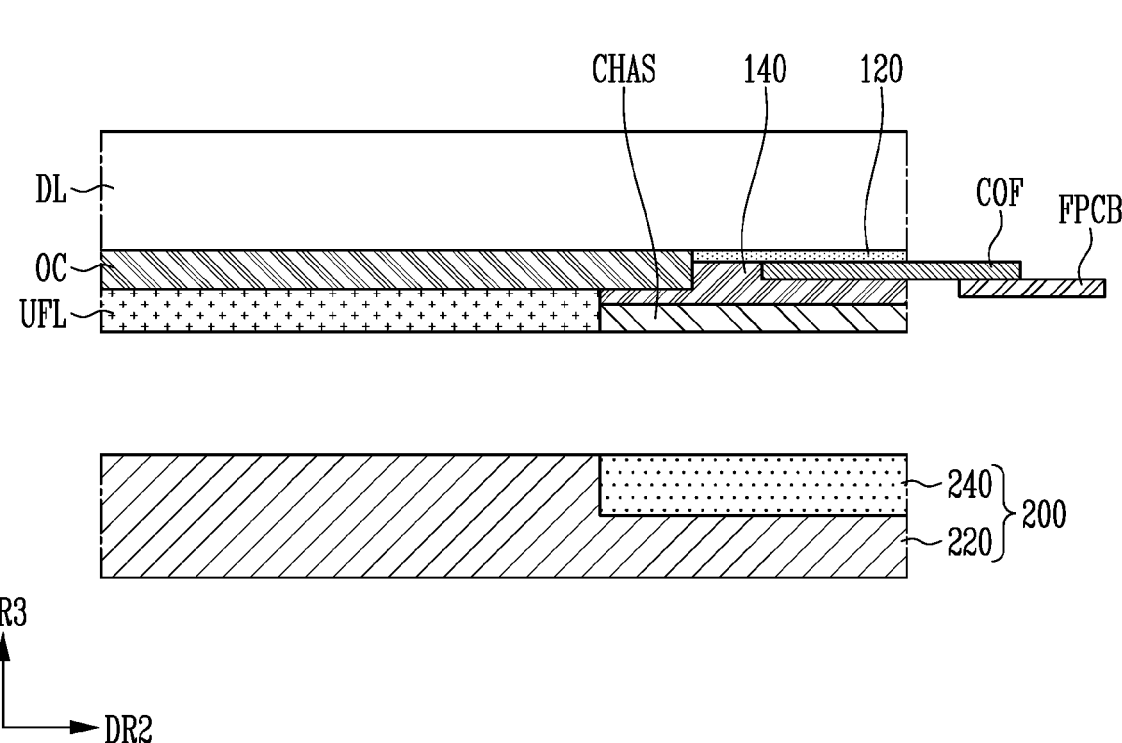

FIGS. 8 to 13 are schematic process sectional views illustrating a manufacturing method for the display device in accordance with an embodiment of the disclosure. FIGS. 8 to 10 illustrate a manufacturing method for the display device DD in accordance with a first embodiment of the disclosure. FIGS. 11 to 13 illustrate a manufacturing method for the display device DD in accordance with a second embodiment of the disclosure.

First, the manufacturing method for the display device DD in accordance with the first embodiment of the disclosure will be described with reference to FIGS. 8 to 10.

First, referring to FIG. 8, a display layer DL may be provided (or prepared), an overcoat layer OC may be disposed (or provided) on an area of the display layer DL, an outer film layer UFL may be disposed (or provided) on the overcoat layer OC, and a first coupling layer 120 may be disposed (or provided) on the display layer DL. A chassis module 1000 may be provided (or prepared), in which a chassis CHAS, a chip-on-film COF, a flexible circuit board FPCB, and a second coupling layer 140 are connected to each other.

In order to provide the display layer DL, a pixel circuit layer PCL and a display element layer DPL may be disposed (or provided) on a substrate SUB. In an example, individual components of the pixel circuit layer PCL may be formed by patterning a conductive layer, an inorganic material, an organic material, or the like by a process using an ordinary mask. Light emitting elements LD may be disposed after the pixel circuit layer PCL is provided. In accordance with an embodiment, the light emitting elements LD may be disposed by using an inkjet process.

The first coupling layer 120 may be disposed on the display layer DL while being adjacent to the overcoat layer OC. As a subsequent process is performed, the first coupling layer 120 may be disposed at a position at which the chip-on-film COF and a line of the display layer DL can be electrically connected to each other.

In accordance with an embodiment, the chassis module 1000 may include the chassis CHAS, the chip-on-film COF, the flexible circuit board FPCB, and the second coupling layer 140. For example, a portion of the second coupling layer 140 may be connected to the chassis CHAS, and another portion of the second coupling layer 140 may be connected to the chip-on-film COF.

In this phase, the chassis module 1000 is one in which the chassis CHAS and the chip-on-film COF are provided in a module form, and may be a component for collectively disposing the chassis CHAS and the chip-on-film COF on the display layer DL.

Referring to FIG. 9, the chassis module 1000 may be moved to be adjacent to the display layer DL. The chassis module 1000 may be moved in a thickness direction of the display layer DL (e.g., the third direction DR3).

In this phase, the chassis module 1000 may be provided on the first coupling layer 120. The chip-on-film COF of the chassis module 1000 may contact the first coupling layer 120. The chip-on-film COF of the chassis module 1000 may face the first coupling layer 120.

In this phase, the chassis CHAS and the chip-on-film COF may be simultaneously moved. As described above, the chassis CHAS and the chip-on-film COF are modularized, so that processes for the chassis CHAS and the chip-on-film COF can be collectively performed.

The chassis module 1000 may be moved by using a vacuum pick-up method. In some embodiments, the chassis module 1000 may be moved by using an electromagnet. However, the disclosure is not limited to the above-described example, and various methods may be used to move the chassis module 1000.

In this phase, the first coupling layer 120 may electrically connect a line included in the display layer DL and the chip-on-film COF to each other. In some embodiments, as described above, the first coupling layer 120 may include a conductive material and electrically connect the chip-on-film COF to the display layer DL.

In accordance with an embodiment, each component of the chassis module 1000 and the first coupling layer 120 may have thickness (e.g., predetermined or selectable thicknesses).

The first coupling layer 120 may have a (1_1)th thickness 1220. For example, the (1_1)th thickness 1220 may be about 8 μm to about 12 μm. The (1_1)th thickness 1220 may be about 9 μm to about 11 μm.

The chip-on-film COF may have a (2_1)th thickness 1240. For example, the (2_1)th thickness 1240 may be about 30 μm to about 50 μm.

The second coupling layer 140 may include a (3_1)th thickness 1260. For example, the (3_1)th thickness 1260 may be about 40 μm to about 80 μm. The (3_1)th thickness 1260 may be about 50 μm to about 70 μm.

The chassis CHAS may have a (4_1)th thickness 1280. For example, the (4_1)th thickness 1280 may be about 20

μm to about 100 μm. The (4_1)th thickness 1280 may be about 20 μm to about 80 μm.

In this phase, the first coupling layer 120 and the second coupling layer 140 may be in a state in which the first coupling layer 120 and the second coupling layer 140 are not separately compressed. In accordance with an embodiment, the (3_1)th thickness 1260 of the second coupling layer 140 may be greater than the (2_1)th thickness 1240 of the chip-on-film COF.

Referring to FIG. 10, the chassis CHAS and the chip-on-film COF may be disposed (or provided) on the display layer DL by performing a thermal compression process. Shapes of the first coupling layer 120 and the second coupling layer 140 may be deformed and cured.

In this phase, heat may be provided such that the first coupling layer 120 and the second coupling layer 140 can be cured. In some embodiments, ultraviolet (UV) light may be provided to cure resins of the first coupling layer 120 and the second coupling layer 140. For example, in order to cure the first coupling layer 120, heat may be provided such that the first coupling layer 120 has a temperature range (e.g., a predetermined or selectable temperature range). In order to cure the second coupling layer 140, heat may be provided such that the second coupling layer 140 has a temperature range. The temperature range in which the first coupling layer 120 is cured may be about 270° C. to about 330° C., and the temperature range in which the second coupling layer 140 is cured may be about 60° C. to about 80° C. However, the temperature range in which each layer is cured may be appropriately adjusted, and is not limited to a specific range.

In this phase, pressure may be applied to a surface of the chassis CHAS. Accordingly, the thicknesses of the first coupling layer 120 and the second coupling layer 140 can be decreased.

For example, in an area in which the first coupling layer 120, the second coupling layer 140, the chip-on-film COF, and the chassis CHAS overlap each other in a plan view, the first coupling layer 120 may have a (1_2)th thickness 1420, the chip-on-film COF may have a (2_2)th thickness 1440, the second coupling layer 140 may have a (3_2)th thickness 1460, and the chassis CHAS may have a (4_2)th thickness 1480.

The first coupling layer 120 and the second coupling layer 140 may have a fluidal property until before the first coupling layer 120 and the second coupling layer 140 are cured at a certain or selectable level or higher. The first coupling layer 120 and the second coupling layer 140 may be compressed by a process in this phase. Accordingly, the (1_2)th thickness 1420 may be smaller than the (1_1)th thickness 1220, and the (3_2)th thickness 1460 may be smaller than the (3_1)th thickness 1260. For example, the (1_2)th thickness 1420 may be about 1 μm to about 3 μm, and the (3_2)th thickness 1460 may be about 4 μm to about 8 μm. In some embodiments, the (1_2)th thickness 1420 may be about 1.5 μm to about 2.5 μm, and the (3_2)th thickness 1460 may be about 5 μm to about 7 μm.

The chip-on-film COF and the chassis CHAS may not have a fluidal property, and accordingly, the thickness of each component may not be substantially changed even in case that the process in this phase is performed. For example, the (2_1)th thickness 1240 and the (2_2)th thickness 1440 may be substantially equal to each other. The (4_1)th thickness 1280 and the (4_2)th thickness 1480 may be substantially equal to each other.

In this phase, compression on the chassis CHAS may be performed such that a height of an outer surface of the chassis CHAS substantially corresponds to a height of an outer surface of the outer film layer UFL. For example, a sum of the (1_2)th thickness 1420, the (2_2)th thickness 1440, the (3_2)th thickness 1460, and the (4_2)th thickness 1480 may have a difference (e.g., a predetermined or selectable difference) (e.g., about 5 μm) or less with a sum of thicknesses of the overcoat layer OC and the outer film layer UFL. The sum of the (1_2)th thickness 1420, the (2_2)th thickness 1440, the (3_2)th thickness 1460, and the (4_2)th thickness 1480 may be substantially equal to the sum of the thicknesses of the overcoat layer OC and the outer film layer UFL.

In this phase, as the chassis module 1000 is compressed, the first coupling layer 120 and the second coupling layer 140 may be diffused to fill a cavity. Accordingly, the display layer DL can be thoroughly protected from external influence.

In accordance with an embodiment, in this phase, the chassis CHAS and the chip-on-film COF may be connected to each other on the display layer DL. For example, the chassis CHAS and the chip-on-film COF may be provided on the display layer DL by a single process. For example, as compared with that, conventionally, a process of attaching the chip-on-film COF and a process of attaching the chassis CHAS were separately performed, the process is simplified, so that process cost can be saved. In particular, after the chassis module 1000 is formed, the components of the chassis module 1000 are collectively disposed on the display layer DL, thereby improving process convenience. The first coupling layer 120 and the second coupling layer 140 are separately provided, and the chassis CHAS is connected by the thermal compression process. Hence, the height of the chassis CHAS can be thoroughly controlled.

The manufacturing method for the display device DD in accordance with the second embodiment of the disclosure will be described with reference to FIGS. 11 to 13. In FIGS. 11 to 13, descriptions of portions overlapping those described above will be simplified or omitted.

The manufacturing method for the display device DD in accordance with the second embodiment of the disclosure is different from the manufacturing method for the display device DD in accordance with the first embodiment of the disclosure, in that the chassis module 1000 is disposed on a chassis provider 200 in a state in which a position of the chassis provider 200 is fixed, and a process is performed while the display panel DP is moved.

Referring to FIG. 11, the first coupling layer 120 may be disposed on the display layer DL, and the chassis module 1000 may be the chassis provider 200.

The chassis provider 200 may include a guide jig 220 and a module catching part 240. In accordance with an embodiment, the guide jig 220 may guide a position at which the chassis CHAS is disposed. The guide jig 220 may restrict motion of the chassis CHAS in a direction (e.g., a direction in which the chassis CHAS extends). For example, the motion (or movement) of the chassis CHAS in the direction may be restricted by the guide jig 220.

The module catching part 240 may fix a position of the chassis module 1000. For example, the module catching part 240 may be operated in a connection mode in which the module catching part 240 is connected to the chassis module 1000 or a release mode in which the connection between the module catching part 240 and the chassis module 1000 is released. In accordance with an embodiment, the module catching part 240 may include an electromagnet. For example, in case that the module catching part 240 includes the electromagnet, the module catching part 240 may control an intensity of current, thereby changing the intensity of magnetism provided from the module catching part 240.

In accordance with an embodiment, before the chassis module 1000 is provided on the display layer DL, the module catching part 240 may be operated in the connection mode such that the position of the chassis module 1000 is fixed.

In this phase, a surface of the module catching part 240 may contact the chassis CHAS.

In this phase, with respect to a gravity direction, the chassis provider 200 may be disposed under the display layer DL. The second coupling layer 140 may be disposed on the chassis CHAS, and the chip-on-film COF may be disposed on the second coupling layer 140, so that the chassis module 1000 faces the display layer DL.

In this phase, with respect to the gravity direction, the outer film layer UFL may be disposed to face the chassis provider 200, and the display layer DL may be disposed to face in the opposite direction of the gravity direction (e.g., the third direction DR3). For example, in this phase, the overcoat layer OC and the outer film layer UFL may be more adjacent to the chassis provider 200 than to the display layer DL.

In this phase, the first coupling layer 120 may be disposed on the display layer DL. The area in which the first coupling layer 120 is disposed is an area in which the first coupling layer 120 can contact the chip-on-film COF, and may be an area in which the first coupling layer 120 can electrically connect the chip-on-film COF and a line of the display layer DL to each other.

Referring to FIG. 12, the display layer DL may descend, thereby decreasing a distance between the display layer DL and the chassis provider 200.

In this phase, the display layer DL and the first coupling layer 120 disposed on the display layer DL may descend in the gravity direction, and accordingly, the second coupling layer 140 may be connected to the first coupling layer 120 and the overcoat layer OC.

In this phase, the first coupling layer 120 and the second coupling layer 140 may be compressed and deformed. In some embodiments, the first coupling layer 120 and the second coupling layer 140 may be compressed such that the height of the chassis CHAS corresponds to a height of the outer film layer UFL.

In this phase, the position of the chassis CHAS may be appropriately disposed, and the first coupling layer 120 and the second coupling layer 140 may be cured. In some embodiments, heat may be applied such that the first coupling layer 120 and the second coupling layer 140 are cured. For example, the chassis CHAS may be disposed not to overlap the outer film layer UFL. The position of the chassis CHAS may be controlled such that the height of the outer surface of the chassis CHAS and the height of the outer surface of the outer film layer UFL are equal to each other.

Referring to FIG. 13, the chassis provider 200 may be spaced apart from the display layer DL and the chassis CHAS. In this phase, the display layer DL and the chassis CHAS may be connected to each other by the first coupling layer 120 and the second coupling layer 140.

In this phase, after the first coupling layer 120 and the second coupling layer 140 are cured, the module catching part 240 may be operated in the release mode. Accordingly, the module catching part 240 may be released from the chassis CHAS after the chassis CHAS is disposed on the display layer DL. For example, in case that the module catching part 240 is an electromagnet, the module catching part 240 may block current provided to the electromagnet, thereby allowing the electromagnet not to provide magnetism. Accordingly, the module catching part 240 may be operated in the release mode, thereby releasing the chassis CHAS.

Similar to the above-described embodiment, in this embodiment, the chassis CHAS and the chip-on-film COF are collectively attached to the display layer DL by using the first coupling layer 120 and the second coupling layer 140, so that process performance can be improved.

Subsequently, although not shown in any drawing, the display panel DP to which the chassis CHAS is attached is disposed such that the display layer DL face in the gravity direction, so that the display device DD in accordance with the embodiment of the disclosure can be provided.

In accordance with the disclosure, there can be provided a manufacturing method for a display device and a display device manufactured using the same, which can improve process performance and simplify process phases.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method for manufacturing a display device, the method comprising:
   providing a display layer including a light emitting element;
   providing a first coupling layer on the display layer;
   providing a chassis module including a chassis, a second coupling layer, and a chip-on-film;
   moving the chassis module; and
   disposing the chassis module on the first coupling layer, wherein the disposing of the chassis module on the first coupling layer includes deforming the first coupling layer and the second coupling layer by compressing the chassis module.

2. The method of claim 1, comprising:
   disposing an overcoat layer on an area of the display layer; and
   disposing an outer film layer on the overcoat layer.

3. The method of claim 1, wherein the disposing of the chassis module on the first coupling layer includes allowing the first coupling layer to electrically connect a line included in the display layer and the chip-on-film to each other.

4. The method of claim 3, wherein, in the chassis module, one surface of the second coupling layer contacts the chassis, and another surface of the second coupling layer contacts the chip-on-film.

5. The method of claim 4, wherein the disposing of the chassis module on the first coupling layer includes allowing the chip-on-film of the chassis module to face the first coupling layer.

6. The method of claim 1, wherein the moving of the chassis module includes simultaneously moving the chassis and the chip-on-film.

7. The method of claim 6, wherein the chassis module is moved by using a vacuum pick-up method or an electromagnet.

8. The method of claim 1, wherein the disposing of the chassis module on the first coupling layer includes:
   allowing the chassis to be connected to the display layer by the first coupling layer and the second coupling layer; and
   allowing the chip-on-film to be connected to the display layer by the first coupling layer.

9. The method of claim 1, wherein the disposing of the chassis module on the first coupling layer includes curing the first coupling layer and the second coupling layer.

10. The method of claim 2, wherein, in an area in which the first coupling layer, the second coupling layer, the chip-on-film, and the chassis overlap one another in a plan view, a sum of thicknesses of the first coupling layer, the second coupling layer, the chip-on-film, and the chassis is equal to a sum of thicknesses of the overcoat layer and the outer film layer.

11. The method of claim 1, wherein the chassis is disposed at a side of the display device, and has a plate shape.

12. The method of claim 11, wherein the chassis has a thickness in a range of about 20 μm to about 100 μm.

13. The method of claim 1, wherein
   the first coupling layer includes a conductive material and a resin material,
   the second coupling layer includes a resin material without including any conductive material,
   a portion of the second coupling layer contacts the first coupling layer, and another portion of the second coupling layer contacts the chassis.

14. The method of claim 2, wherein
   the display layer includes a first area and a second area,
   in the first area, the display layer overlaps the first coupling layer, the second coupling layer, the chip-on-film, and the chassis in a plan view, and
   in the second area, the display layer overlaps the overcoat layer and the outer film layer in a plan view.

15. A method for manufacturing a display device, the method comprising:
   providing a display layer including a light emitting element;
   providing a first coupling layer on the display layer;
   connecting a chassis module to a chassis provider including a guide jig and a module catching part, the chassis module including a chassis, a second coupling layer, and a chip-on-film;
   moving the display layer on which the first coupling layer is provided along a gravity direction to be adjacent to the chassis module;
   disposing the chassis module on the display layer; and
   allowing the display layer to be spaced apart from the chassis provider.

16. The method of claim 15, wherein the disposing of the chassis module on the display layer includes:
   deforming the first coupling layer and the second coupling layer by compressing the chassis module; and
   curing the first coupling layer and the second coupling layer.

17. The method of claim 15, wherein the module catching part includes an electromagnet, and is operated in a connection mode in which the module catching part is connected to the chassis module or a release module in which a connection between the module catching part and the chassis module is released.

18. A display device manufactured according to the method of claim 15.

19. A display device comprising:

a display layer on a substrate, the display layer including a light emitting element;

an outer film layer on the display layer;

a flexible circuit board providing an electrical signal provided to the display layer;

a chip-on-film including one end connected to the display layer and another end connected to the flexible circuit board;

an anisotropic conductive film on the display layer, the anisotropic conductive film overlapping the chip-on-film in a plan view;

a non-conductive film on the anisotropic conductive film and the chip-on-film; and a chassis on the non-conductive film, wherein the anisotropic conductive film connects the chip-on-film to the display layer, the non-conductive film connects the chassis to the aniso-tropic conductive film, and the chassis has a plate shape not including any bending area.

* * * * *